(12) United States Patent
Cox et al.

(10) Patent No.: US 9,585,249 B2
(45) Date of Patent: *Feb. 28, 2017

(54) CIRCUIT BOARD

(71) Applicant: E. I. DU PONT DE NEMOURS AND COMPANY, Wilmington, DE (US)

(72) Inventors: Sidney G. Cox, Durham, NC (US); Christopher Dennis Simone, Pickerington, OH (US); Carl Robert Haeger, Reynoldsburg, OH (US); Richard A. Wessel, Raleigh, NC (US)

(73) Assignee: E I DU PONT DE NEMOURS AND COMPANY, Wilmington, DE (US)

( * ) Notice: Subject to any disclaimer, the term of this patent is extended or adjusted under 35 U.S.C. 154(b) by 116 days.

This patent is subject to a terminal disclaimer.

(21) Appl. No.: 14/410,116

(22) PCT Filed: Jun. 21, 2013

(86) PCT No.: PCT/US2013/046938
§ 371 (c)(1),
(2) Date: Dec. 22, 2014

(87) PCT Pub. No.: WO2013/192471
PCT Pub. Date: Dec. 27, 2013

(65) Prior Publication Data
US 2015/0359092 A1 Dec. 10, 2015

Related U.S. Application Data

(60) Provisional application No. 61/663,270, filed on Jun. 22, 2012, provisional application No. 61/663,254, filed on Jun. 22, 2012, provisional application No. 61/663,258, filed on Jun. 22, 2012, provisional application No. 61/663,280, filed on Jun. 22, 2012, provisional application No. 61/663,291, filed on Jun. 22, 2012.

(51) Int. Cl.
| | |
|---|---|
| B32B 3/10 | (2006.01) |
| H05K 1/05 | (2006.01) |
| H01B 3/30 | (2006.01) |
| H05K 1/02 | (2006.01) |
| H05K 1/03 | (2006.01) |
| H05K 3/28 | (2006.01) |
| B32B 15/08 | (2006.01) |
| B32B 15/20 | (2006.01) |
| B32B 27/28 | (2006.01) |
| C08G 73/10 | (2006.01) |
| H05K 1/09 | (2006.01) |
| B32B 7/12 | (2006.01) |
| B32B 27/20 | (2006.01) |
| H05K 3/02 | (2006.01) |

(52) U.S. Cl.
CPC ........... *H05K 1/056* (2013.01); *B32B 7/12* (2013.01); *B32B 15/08* (2013.01); *B32B 15/20* (2013.01); *B32B 27/20* (2013.01); *B32B 27/281* (2013.01); *C08G 73/105* (2013.01); *C08G 73/1039* (2013.01); *C08G 73/1042* (2013.01); *C08G 73/1067* (2013.01); *C08G 73/1071* (2013.01); *H01B 3/306* (2013.01); *H05K 1/0271* (2013.01); *H05K 1/0298* (2013.01); *H05K 1/036* (2013.01); *H05K 1/0346* (2013.01); *H05K 1/0373* (2013.01); *H05K 1/09* (2013.01); *H05K 3/281* (2013.01); *B32B 2307/204* (2013.01); *B32B 2307/206* (2013.01); *B32B 2307/302* (2013.01); *B32B 2307/4026* (2013.01); *B32B 2457/00* (2013.01); *B32B 2457/08* (2013.01); *H05K 3/022* (2013.01); *H05K 2201/0154* (2013.01); *H05K 2201/0323* (2013.01); *Y10T 428/24851* (2015.01); *Y10T 428/263* (2015.01); *Y10T 428/264* (2015.01); *Y10T 428/266* (2015.01); *Y10T 428/31681* (2015.04)

(58) Field of Classification Search
CPC ............................................. Y10T 428/24851
See application file for complete search history.

(56) References Cited

U.S. PATENT DOCUMENTS

| | | |
|---|---|---|
| 2006/0205891 A1 | 9/2006 | Tanaka et al. |
| 2008/0182112 A1 | 7/2008 | Kaneshiro |
| 2009/0035591 A1 | 2/2009 | Nishikawa et al. |

(Continued)

FOREIGN PATENT DOCUMENTS

| | | |
|---|---|---|
| WO | 2011/019889 A1 | 2/2011 |
| WO | 2011/063247 A2 | 5/2011 |
| WO | 2012/011970 A1 | 1/2012 |

OTHER PUBLICATIONS

ASTM #D822-02, "Standard Test Method for Tensile Properties of Thin Plastic Sheeting".
ASTM #D150-11, "Standard Test Method for AC Loss Characteristics and Permittivity (Dielectric Constant) of Solid Electrical Insulation".
International Search Report, PCT/US2013/046938, Dated Oct. 9, 2013.

*Primary Examiner* — Christopher Polley

(57) ABSTRACT

The present disclosure is directed to a circuit board having a first polyimide coverlay, a first imaged metal layer, a first electrically insulating layer, a second imaged metal layer, a polyimide bondply, a third imaged metal layer, a second electrically insulating layer, a forth imaged metal layer and a second polyimide coverlay. The first polyimide coverlay, the polyimide bondply and the second polyimide coverlay are derived from 100 mole % 3,3',4,4'-biphenyl tetracarboxylic dianhydride, 20 to 90 mole % 2,2'-bis(trifluoromethyl) benzidine, and 10 to 80 mole % 4,4'-oxydianiline.

24 Claims, No Drawings

(56) References Cited

U.S. PATENT DOCUMENTS

| | | | |
|---|---|---|---|
| 2009/0078453 A1* | 3/2009 | Jung | C08G 73/1042 174/254 |
| 2011/0177321 A1* | 7/2011 | Carney | C08G 73/105 428/323 |
| 2012/0141758 A1* | 6/2012 | Boussaad | C08J 5/18 428/220 |
| 2012/0227790 A1* | 9/2012 | Auman | C08G 73/1042 136/249 |
| 2013/0196134 A1* | 8/2013 | Carney | C08L 79/08 428/220 |

* cited by examiner

CIRCUIT BOARD

FIELD OF DISCLOSURE

This disclosure relates generally to a circuit board. More specifically, the circuit board comprises a polyimide bond-ply.

BACKGROUND OF THE DISCLOSURE

Metal clad laminates for circuit board construction are constructed by laminating a polyimide film to a metal foil with an adhesive layer in between. The adhesive layer may consist of conventional adhesives (acrylates, epoxides, polyamides, phenolic resins, etc.) where the adhesive is cured during the metal foil lamination. However, these conventional adhesives do not usually possess the high temperature heat stability of the base polyimide dielectric, and the strength of the adhesive bonds in the multiplayer laminate structure deteriorates rapidly when subjected to elevated temperatures. These adhesives also show high electric loss in high speed circuit layers due to the high loss tangent of these adhesives.

As electronic packaging becomes more sophisticated and the desire for thinner, smaller, light weight, flexible, electronic components with low CTE, low moisture absorption, high temperature heat stability and high modulus have necessitated the elimination of the adhesive layer.

One means to an adhesiveless laminate is to coat a high modulus polyimide film core layer with a thin layer of polyamic acid precursor solution on both sides, dry this layer, and finally imidize the applied coating to create a thermoplastic polyimide. Copper foil is then laminated with heat and pressure to create a double sided copper clad laminate.

A polyimide precursor can also be coated directly onto copper foil and then cured to create a polyimide film with copper foil on one side. This is a common method of making adhesiveless copper clad films but can create polyimide clads with copper on just one side. Another method of making adhesiveless polyimide copper clad laminates is to start with a standard rigid polyimide base film. A thin metal layer is deposited, typically by sputtering or vapor deposition to improve adhesion between the metal and the polyimide. Then the copper is electroplated up to the required thickness to create a double sided copper clad laminate.

Each of these suffers from one or more of the following disadvantages: requisite additional steps as opposed to lamination of a metal foil(s) to polyimide film, inferior adhesion of the metal foil to the polyimide when an adhesive is used, multiple layers of polyimide add to overall the thickness of the construction.

For the forgoing reasons, a need exists for polyimide films that can be directly laminated/adhered to metal foils without using an adhesive to providing thinner, flexible electronic components with low CTE, low moisture absorption, high temperature heat stability while maintaining good mechanical and electrical properties.

DETAILED DESCRIPTION

Definitions

As used herein, the terms "comprises," "comprising," "includes," "including," "has," "having" or any other variation thereof, are intended to cover a non-exclusive inclusion. For example, a method, process, article, or apparatus that comprises a list of elements is not necessarily limited only to those elements but may include other elements not expressly listed or inherent to such method, process, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Also, use of the "a" or "an" are employed to describe elements and components of the invention. This is done merely for convenience and to give a general sense of the invention. This description should be read to include one or at least one and the singular also includes the plural unless it is obvious that it is meant otherwise.

The term "dianhydride" as used herein is intended to include precursors, derivatives or analogs thereof, which may not technically be a dianhydride but would nevertheless react with a diamine to form a polyamic acid which could in turn be converted into a polyimide.

The term "diamine" as used herein is intended to include precursors, derivatives or analogs thereof, which may not technically be a diamine but would nevertheless react with a dianhydride to form a polyamic acid which could in turn be converted into a polyimide.

The term "polyamic acid" as used herein is intended to include any polyimide precursor material derived from a combination of dianhydride and diamine and capable of conversion to a polyimide.

The term "film" as used herein is intended to mean a free-standing film or a (self-supporting or non-self-supporting) coating. The term "film" is used interchangeably with the term "layer".

The term "chemical conversion" or "chemically converted" as used herein denotes the use of a catalyst (accelerator) or dehydrating agent (or both) to convert the polyamic acid to polyimide and is intended to include a partially chemically converted polyimide which is then dried at elevated temperatures to a solids level greater than 98%.

The term "metal" as used herein is intended to include elemental metals and metal alloys.

The term "direct contact" as used herein is intended to mean that layers are in contact with one another at their interface and an intervening layer, such as an adhesive layer, is not present.

When an amount, concentration, or other value or parameter is given as either a range, preferred range or a list of upper preferable values and lower preferable values, this is to be understood as specifically disclosing all ranges formed from any pair of any upper range limit or preferred value and any lower range limit or preferred value, regardless of whether ranges are separately disclosed. Where a range of numerical values is recited herein, unless otherwise stated, the range is intended to include the endpoints thereof, and all integers and fractions within the range. Numerical values are to be understood to have the precision of the number of significant figures provided. For example, the number 1 shall be understood to encompass a range from 0.5 to 1.4, whereas the number 1.0 shall be understood to encompass a range from 0.95 to 1.04, including the end points of the stated ranges. It is not intended that the scope of the invention be limited to the specific values recited when defining a range.

In describing certain polymers it should be understood that sometimes applicants are referring to the polymers by the monomers used to make them or the amounts of the monomers used to make them. While such a description may not include the specific nomenclature used to describe the final polymer or may not contain product-by-process terminology, any such reference to monomers and amounts should be interpreted to mean that the polymer is made from those monomers, unless the context indicates or implies otherwise.

The materials, methods, and examples herein are illustrative only and, except as specifically stated, are not intended to be limiting. Although methods and materials similar or equivalent to those described herein can be used, suitable methods and materials are described herein.

The present disclosure is directed to a thermoset polyimide film that can be directly adhered to metal and have good peel strength without the need for an additional adhesive layer. Good peel strength, for a metal clad laminate for the purpose of this disclosure, is at least 1 N/mm. Good peel strength for a coverlay or a bondply is 0.7 to 2 N/mm.

In some embodiments, a polyimide film (polyimide layer or polyimide coverlay or polyimide bondply or electrically insulating layer) comprises a polyimide derived from 100 mole % 3,3',4,4'-biphenyl tetracarboxylic dianhydride, 20 to 90 mole % 2,2'-bis(trifluoromethyl) benzidine, and 10 to 80 mole % 4,4'-oxydianiline and is capable of directly adhering to metal and other polymers at lamination temperatures from 300 to 380° C.

In some embodiments, a polyimide film (polyimide layer or polyimide coverlay or polyimide bondply or electrically insulating layer) comprises a polyimide derived from 100 mole % 3,3',4,4'-biphenyl tetracarboxylic dianhydride, 20 to 90 mole % 2,2'-bis(trifluoromethyl) benzidine, and 10 to 80 mole % 4,4'-oxydianiline and is capable of directly adhering to metal and other polymers at lamination temperatures from 330 to 380° C.

In some embodiments, a polyimide film (polyimide layer or polyimide coverlay or polyimide bondply or electrically insulating layer) comprises a polyimide derived from 100 mole % 3,3',4,4'-biphenyl tetracarboxylic dianhydride, 40 to 90 mole % 2,2'-bis(trifluoromethyl) benzidine, and 10 to 60 mole % 4,4'-oxydianiline and is capable of directly adhering to metal and other polymers at lamination temperatures from 320 to 380° C.

In some embodiments, a polyimide film (polyimide layer or polyimide coverlay or polyimide bondply or electrically insulating layer) comprises a polyimide derived from 100 mole % 3,3',4,4'-biphenyl tetracarboxylic dianhydride, 20 to 30 mole % 2,2'-bis(trifluoromethyl) benzidine, and 70 to 80 mole % 4,4'-oxydianiline and is capable of directly adhering to metal and other polymers at lamination temperatures from 330 to 380° C.

In some embodiments, a polyimide film (polyimide layer or polyimide coverlay or polyimide bondply or electrically insulating layer) comprises a polyimide derived from 100 mole % 3,3',4,4'-biphenyl tetracarboxylic dianhydride, 20 to 90 mole % 2,2'-bis(trifluoromethyl) benzidine, and 10 to 80 mole % 4,4'-oxydianiline and is capable of directly adhering to metal and other polymers at lamination temperatures of at least 300, 320, 330 or 350° C.

In some embodiments, a polyimide film (polyimide layer or polyimide coverlay or polyimide bondply or electrically insulating layer) comprises a polyimide derived from 100 mole % 3,3',4,4'-biphenyl tetracarboxylic dianhydride, 40 to 90 mole % 2,2'-bis(trifluoromethyl) benzidine, and 10 to 80 mole % 4,4'-oxydianiline is capable of directly adhering to metal and other polymers at lamination temperatures of at least 300, 320, 330 or 350° C.

A polyimide derived from 100 mole % 3,3',4,4'-biphenyl tetracarboxylic dianhydride, 100 mole % 2,2'-bis(trifluoromethyl) benzidine, is capable of directly adhering to metal and other polymers at lamination temperatures from 380 to 400° C.

Thus the polyimides of the present disclosure are useful for any application where direct adherence of a polyimide to metal is beneficial and thin, flexible electronic components with low CTE, low moisture absorption are desired such as, but not limited to, metal clad laminates, coverlays and bondplys.

Metal Clad Laminate

In some embodiments, the polyimide metal clad laminate of the present disclosure comprises a metal foil and a polyimide layer. The polyimide layer having a first side and a second side, the first side in direct contact with the metal foil, the polyimide layer comprising: a polyimide derived from 100 mole % 3,3',4,4'-biphenyl tetracarboxylic dianhydride, 20 to 90 mole % 2,2'-bis(trifluoromethyl) benzidine, and 10 to 80 mole % 4,4'-oxydianiline; wherein the polyimide metal clad laminate does not have an adhesive layer between the metal foil and the polyimide layer. The polyimide metal clad laminate has a peel strength of from 1 to 3.3 N/mm, as measured in accordance with IPC-TM-650-2.4.9d, when the metal foil and the polyimide layer are laminated together at a lamination temperature from 320 to 380° C. and a pressure from 150 psi (10.55 Kg/cm) to 400 psi (28.13 Kg/cm).

In one embodiment, the polyimide metal clad laminate of the present disclosure comprises a metal foil and a polyimide layer. The polyimide layer having a first side and a second side, the first side in direct contact with the metal foil, the polyimide layer comprising: a polyimide derived from 100 mole % 3,3',4,4'-biphenyl tetracarboxylic dianhydride, 40 to 90 mole % 2,2'-bis(trifluoromethyl) benzidine, and 10 to 60 mole % 4,4'-oxydianiline; wherein the polyimide metal clad laminate does not have an adhesive layer between the metal foil and the polyimide layer. The polyimide metal clad laminate has a peel strength of from 1 to 3 N/mm, as measured in accordance with IPC-TM-650-2.4.9d, when the metal foil and the polyimide layer are laminated together at a lamination temperature from 320 to 380° C. and a pressure from 150 psi (10.55 Kg/cm) to 400 psi (28.13 Kg/cm).

In another embodiment, the polyimide metal clad laminate of the present disclosure comprises a metal foil and a polyimide layer. The polyimide layer having a first side and a second side, the first side in direct contact with the metal foil, the polyimide layer comprising: a polyimide derived from 100 mole % 3,3',4,4'-biphenyl tetracarboxylic dianhydride, 20 to 30 mole % 2,2'-bis(trifluoromethyl) benzidine, and 70 to 80 mole % 4,4'-oxydianiline; wherein the polyimide metal clad laminate does not have an adhesive layer between the metal foil and the polyimide layer. The polyimide metal clad laminate has a peel strength of from 1 to 3.2 N/mm, as measured in accordance with IPC-TM-650-2.4.9d, when the metal foil and the polyimide layer are laminated together at a lamination temperature from 330 to 350° C. and a pressure from 150 psi (10.55 Kg/cm) to 400 psi (28.13 Kg/cm).

In another embodiment, polyimide metal clad laminate comprises a metal foil and a polyimide layer having a first side and a second side, the first side in direct contact with the metal foil, the polyimide layer comprising: a polyimide derived from 100 mole % 3,3',4,4'-biphenyl tetracarboxylic dianhydride, and 100 mole % 2,2'-bis(trifluoromethyl) benzidine; wherein the polyimide metal clad laminate does not have an adhesive layer between the metal foil and the polyimide layer, and wherein the polyimide metal clad laminate has a peel strength of from 1 to 3 N/mm, as measured in accordance with IPC-TM-650-2.4.9d, when the metal foil and the polyimide layer are laminated together at a lamination temperature from 380 to 400° C. and a pressure from 150 psi (10.55 Kg/cm) to 400 psi (28.13 Kg/cm).

In some embodiments, the polyimide metal clad laminate of the present disclosure comprises a metal foil and a polyimide layer. The polyimide layer having a first side and a second side, the first side in direct contact with the metal foil, the polyimide layer comprising: a polyimide derived from 100 mole % 3,3',4,4'-biphenyl tetracarboxylic dianhydride, 20 to 90 mole % 2,2'-bis(trifluoromethyl) benzidine, and 10 to 80 mole % 4,4'-oxydianiline; wherein the polyimide metal clad laminate does not have an adhesive layer between the metal foil and the polyimide layer. The polyimide metal clad laminate has a peel strength of at least 1 N/mm, as measured in accordance with IPC-TM-650-2.4.9d, when the metal foil and the polyimide layer are laminated together at a lamination temperature of at least 320° C. and a pressure from 150 psi (10.55 Kg/cm) to 400 psi (28.13 Kg/cm).

In some embodiments, the polyimide is derived from 100 mole % 3,3',4,4'-biphenyl tetracarboxylic dianhydride, between and including any two of the following: 20, 30, 40, 45, 50, 55, 60, 65, 70, 75, 80, 85 and 90 mole % 2,2'-bis(trifluoromethyl) benzidine, and between and including any two of the following: 10, 15, 20, 25, 30, 35, 40, 45, 50, 55, 60, 70 and 80 mole % 4,4'-oxydianiline.

In some embodiments, the polyimide metal clad further comprises a second metal foil in direct contact with the second side of the polyimide layer and wherein the polyimide metal clad laminate does not have an adhesive layer between the second metal foil and the polyimide layer.

In some embodiments, the polyimide metal clad laminate comprises:
a. a metal foil;
b. a polyimide layer having a first side and a second side, the first side in direct contact with the metal foil, the polyimide layer comprising: a polyimide derived from 100 mole % 3,3',4,4'-biphenyl tetracarboxylic dianhydride, 20 to 90 mole % 2,2'-bis(trifluoromethyl) benzidine, and 10 to 80 mole % 4,4'-oxydianiline; and
c. a second metal foil; and
the polyimide metal clad laminate does not have an adhesive layer between the metal foil and the polyimide layer and the polyimide metal clad laminate has a peel strength of from 1 to 3 N/mm, as measured in accordance with IPC-TM-650-2.4.9d, when the metal foil and the polyimide layer are laminated together at a temperature from 320 to 380° C. and a pressure from 150 psi (10.55 Kg/cm) to 400 psi (28.13 Kg/cm).

In some embodiments, the polyimide metal clad laminate comprises:
a. a metal foil;
b. a polyimide layer having a first side and a second side, the first side in direct contact with the metal foil, the polyimide layer comprising: a polyimide derived from 100 mole % 3,3',4,4'-biphenyl tetracarboxylic dianhydride, and 100 mole % 2,2'-bis(trifluoromethyl) benzidine; and
c. a second metal foil.
The polyimide metal clad laminate does not have an adhesive layer between the metal foil and the polyimide layer and does not have an adhesive layer between the second metal foil and the polyimide layer and the polyimide metal clad laminate has a peel strength of from 1 to 3 N/mm, as measured in accordance with IPC-TM-650-2.4.9d, when the metal foil and the polyimide layer are laminated together at a temperature from 320 to 380° C. and a pressure from 150 psi (10.55 Kg/cm) to 400 psi (28.13 Kg/cm).

It is surprising the polyimides of the present disclosure have good peel strength with metals, and imaged metal having exposed polymer areas where the metal was removed, without the need for an adhesive when laminated at temperatures from 320 to 380° C., and in some embodiments, laminated at temperatures from 380 to 400° C., and maintain a good balance of mechanical and electrical properties as well as low CTE. Not all low Tg polyimides have good peel strength, balance of properties and low CTE.

Desirable electrical properties and mechanical properties will depend on the desired end use that the material will be used for. Ordinary skill and experimentation may be necessary in fine tuning properties for desired end use. Generally, good MD tensile modulus is greater than 2.75 GPa, MD tensile strength is greater than 125 MPa, MD elongation is greater than 25%, water uptake less than 1.5%, dielectric constant at 100 Hz less than 3.5 and loss tangent below 0.006.

Another advantage of a single layer polyimide film having the ability to directly adhere to metal foil, is film thickness uniformity can be more easily controlled for thicknesses less than 25 microns via a single slot casting die than a multilayer casted film which relies on a sophisticated layer combining system. All polyimide copper clad laminates can be made with 3 layers; a rigid thermoset polyimide core and thin thermoplastic polyimide coatings on both sides of the polyimide core. However, it is difficult to control the thickness of the thin coatings, plus is requires much more complicated manufacturing methods to make 3 layer film.

Another advantage of a single layer of polyimide film of the present disclosure is that it produces the properties expected of copper clad laminate with a rigid polyimide core and also produces adhesion to copper similar to a thermoplastic polyimide. Good adhesion to copper foil could be achieved with an all thermoplastic polyimide film. However, the all thermoplastic films would have large CTE values (>50) that are unacceptable for metal clad laminates. Also the dimensional stability is poor.

Another advantage is that thinner polyimide films can be made allowing for higher thermal conductivity while maintaining electrical properties.

In some embodiments the polyimide layer (of the polyimide metal clad laminate) is from, between and including any two of the following: 2, 5, 10, 15, 20, 26, 30, 35, 40, 45, 50, 55, 60, 65, 70, 75, 80, 85, 90, 95, 100 and 105 microns thick. In some embodiments, the polyimide layer is from 2 to 26 micron thick. In some embodiments, the polyimide layer is from 27 to 105 micron thick.

Metal Foil—Metal Clad Laminate

In some embodiments, the metal foil is elemental metal. In some embodiments, the metal foil is a metal alloy. In some embodiments, the metal foil is copper. In some embodiments, the metal alloy comprises 50 to 72 weight % nickel. In another embodiment, the metal alloy comprises 50 to 72% weight % nickel an 14 to 24 weight % Chromium. In some embodiments, the metal foil is aluminum.

In some embodiments, the polyimide metal clad laminate further comprises a second metal foil in direct contact with the second side of the polyimide layer and wherein the polyimide metal clad laminate does not have an adhesive layer between the second metal foil and the polyimide layer.

In some embodiments, the second metal foil is elemental metal. In some embodiments, the second metal foil is a metal alloy. In some embodiments, the second metal foil is copper.

In some embodiments, the metal alloy comprises 50 to 72 weight % nickel. In another embodiment, the metal alloy comprises 50 to 72% weight % nickel an 14 to 24 weight % Chromium. In some embodiments, the metal foil is aluminum.

In some embodiments, the metal foil is from 5 to 72 microns thick. In some embodiments, the metal foil is between and including any two of the following: 5, 10, 15, 20, 25, 30, 35, 40, 45, 50, 55, 60, 65, 70 and 72 microns thick. In some embodiments, the metal foil is surface treated to improve adhesion to electrically insulating layers.

In some embodiments, the second metal foil is from 5 to 72 microns thick. In some embodiments, the second metal foil is between and including any two of the following: 5, 10, 15, 20, 25, 30, 35, 40, 45, 50, 55, 60, 65, 70 and 72 microns thick. In some embodiments, the second metal foil is surface treated to improve adhesion to electrically insulating layers.

In some embodiments, the polyimide layer comprises from 1 to 55 weight percent of a thermally conductive filler, dielectric fillers or mixtures thereof. In some embodiments, the polyimide layer comprises between and including any two of the following: 1, 5, 10, 20, 25, 30, 35, 40, 45, 50 and 55 weight percent of a thermally conductive filler, dielectric fillers or mixtures thereof. In some embodiments the thermally conductive filler, dielectric fillers or mixtures thereof are milled to obtain desired filler size and/or break up any agglomerates that may have formed.

The polyimide of the present disclosure can be made by any known thermal conversion or chemical conversion method for making polyimide films or filled polyimide films. In some embodiments, it is desirable to use chemical conversion due to the advantages chemical conversion over thermal conversion such as but not limited to, lower CTE and films are matte on both sides even when cast on to a smooth surface.

In some embodiments, the polyimide layer can be a free standing film that is then directly adhered to metal foil, on one or both sides, using nip roll lamination or vacuum press to form a metal clad laminate. The nip roll or vacuum press must be capable of reaching the required temperature and pressure.

In some embodiments, a polyamic acid can be cast on to metal foil and cured. This process can produce very thin electrically insulating layers (dielectric layers). And optionally another metal foil can be adhered to the other side of the polyimide layer using a nip roll process or vacuum press, capable of reaching the required temperature and pressure.

In some embodiment, the polyimide film can be a free standing film that is then directly adhered to metal foil, on one or both sides, using nip roll lamination or vacuum press to form a metal clad laminate.

In some embodiments a polyimide derived from 100 mole % 3,3',4,4'-biphenyl tetracarboxylic dianhydride, 40 to 90 mole % 2,2'-bis(trifluoromethyl) benzidine, and 10 to 60 mole % 4,4'-oxydianiline is used as a coverlay. In such embodiments, the polyimide is directly adhered to copper and typically another polyimide layer which is exposed after the copper has been imaged to form circuitry.

Circuit Board—Coverlay

One embodiment of the present disclosure is a polyimide coverlay for a circuit board. In such an embodiment, the circuit board, comprises:
 a. a first electrically insulating layer having a first side and a second side;
 b. a first imaged metal layer;
 c. a first polyimide coverlay derived from 100 mole % 3,3',4,4'-biphenyl tetracarboxylic dianhydride, 20 to 90 mole % 2,2'-bis(trifluoromethyl) benzidine, and 10 to 80 mole % 4,4'-oxydianiline and in direct contact with the first imaged metal layer and exposed areas of the first side of the first electrically insulating layer. An adhesive layer is not present between the first imaged metal layer and the first polyimide coverlay. In some embodiments, the first polyimide coverlay has a peel strength from 0.7 to 2 N/mm, as measured in accordance with IPC-TM-650-2.4.9d, when the first polyimide coverlay is laminated to the first imaged metal layer and exposed areas of the first side of the first electrically insulating layer at a lamination temperature from 300 to 380° C. and a pressure from 150 psi (10.55 Kg/cm) to 400 psi (28.13 Kg/cm). The first electrically insulating layer is any electrically insulating material that can withstand the lamination temperature from 300 to 380° C.

In another embodiment, the first polyimide coverlay has a peel strength from 1 to 2 N/mm, as measured in accordance with IPC-TM-650-2.4.9d, when the first polyimide coverlay is laminated to the first imaged metal layer and exposed areas of the first side of the first electrically insulating layer at a lamination temperature from 320 to 380° C. and a pressure from 150 psi (10.55 Kg/cm) to 400 psi (28.13 Kg/cm). The first electrically insulating layer is any electrically insulating material that can withstand the lamination temperature from 320 to 380° C.

Another embodiment of the present disclosure is a polyimide coverlay for a circuit board. In such an embodiment, the circuit board, comprises:
 a. a first electrically insulating layer having a first side and a second side;
 b. a first imaged metal layer;
 c. a first polyimide coverlay derived from 100 mole % 3,3',4,4'-biphenyl tetracarboxylic dianhydride, 40 to 90 mole % 2,2'-bis(trifluoromethyl) benzidine, and 10 to 60 mole % 4,4'-oxydianiline and in direct contact with the first imaged metal layer and exposed areas of the first side of the first electrically insulating layer. An adhesive layer is not present between the first imaged metal layer and the first polyimide coverlay. The first polyimide coverlay has a peel strength from 1 to 2 N/mm, as measured in accordance with IPC-TM-650-2.4.9d, when the first polyimide coverlay is laminated to the first imaged metal layer and exposed areas of the first side of the first electrically insulating layer at a lamination temperature from 320 to 380° C. and a pressure from 150 psi (10.55 Kg/cm) to 400 psi (28.13 Kg/cm). The first electrically insulating layer is any electrically insulating material that can withstand the lamination temperature from 320 to 380° C.

Another embodiment of the present disclosure is a polyimide coverlay for a circuit board. In such an embodiment, the circuit board, comprises:
 a. a first electrically insulating layer having a first side and a second side;
 b. a first imaged metal layer;
 c. a first polyimide coverlay derived from 100 mole % 3,3',4,4'-biphenyl tetracarboxylic dianhydride, 20 to 30 mole % 2,2'-bis(trifluoromethyl) benzidine, and 70 to 80 mole % 4,4'-oxydianiline and in direct contact with the first imaged metal layer and exposed areas of the first side of the first electrically insulating layer. An adhesive layer is not present between the first imaged metal layer and the first polyimide coverlay. The first polyimide coverlay has a peel strength from 1 to 2 N/mm, as measured in accordance with IPC-TM-650-2.4.9d, when the first polyimide coverlay is laminated to the first imaged metal layer and exposed areas of the first side of the first electrically insulating layer at a lamination temperature from 320 to 380° C. and a pressure from 150 psi (10.55 Kg/cm) to 400 psi (28.13 Kg/cm). The first electrically insulating layer is any electrically insulating material that can withstand the lamination temperature from 320 to 380° C.

In some embodiments, the first polyimide coverlay is derived from 100 mole % 3,3',4,4'-biphenyl tetracarboxylic dianhydride, between and including any two of the following: 20, 30, 40, 45, 50, 55, 60, 65, 70, 75, 80, 85 and 90 mole % 2,2'-bis(trifluoromethyl) benzidine, and between and including any two of the following: 10, 15, 20, 25, 30, 35, 40, 45, 50, 55, 60, 70, and 80 mole % 4,4'-oxydianiline.

In some embodiments, the circuit board further comprises a second imaged metal layer on the second side of the first electrically insulating layer.

In some embodiments, the circuit board further comprises a second polyimide coverlay derived from 100 mole % 3,3',4,4'-biphenyl tetracarboxylic dianhydride 20 to 90 mole % 2,2'-bis(trifluoromethyl) benzidine, and 10 to 80 mole % 4,4'-oxydianiline and in direct contact with the second imaged metal layer and exposed areas of the second side of the first electrically insulating layer. An adhesive layer is not present between the second imaged metal layer and the second polyimide coverlay. The second polyimide coverlay has a peel strength from 0.7 to 2 N/mm, as measured in accordance with IPC-TM-650-2.4.9d, when the second polyimide coverlay is laminated to the second imaged metal layer and the exposed areas of the second side of the first electrically insulating layer at a lamination temperature from 300 to 380° C. and a pressure from 150 psi (10.55 Kg/cm) to 400 psi (28.13 Kg/cm).

In some embodiments, the circuit board further comprises a second polyimide coverlay derived from 100 mole % 3,3',4,4'-biphenyl tetracarboxylic dianhydride, 40 to 90 mole % 2,2'-bis(trifluoromethyl) benzidine, and 10 to 60 mole % 4,4'-oxydianiline and in direct contact with the second imaged metal layer and exposed areas of the second side of the first electrically insulating layer. An adhesive layer is not present between the second imaged metal layer and the second polyimide coverlay. The second polyimide coverlay has a peel strength from 1 to 2 N/mm, as measured in accordance with IPC-TM-650-2.4.9d, when the second polyimide coverlay is laminated to the second imaged metal layer and the exposed areas of the second side of the first electrically insulating layer at a lamination temperature from 320 to 380° C. and a pressure from 150 psi (10.55 Kg/cm) to 400 psi (28.13 Kg/cm).

In some embodiments, the second polyimide coverlay is derived from 100 mole % 3,3',4,4'-biphenyl tetracarboxylic dianhydride, between and including any two of the following: 20, 30, 40, 45, 50, 55, 60, 65, 70, 75, 80, 85 and 90 mole % 2,2'-bis(trifluoromethyl) benzidine, and between and including any two of the following: 10, 15, 20, 25, 30, 35, 40, 45, 50, 55, 60, 70 and 80 mole % 4,4'-oxydianiline.

In some embodiments, it is desirable for a coverlay to have optical properties which provide security against unwanted visual inspection and tampering of the electronic components. In some embodiments, the optical density (opacity) desirable (e.g., to hide the conductor traces in the flex circuits from view) is greater than or equal to 2. An optical density of 2 is intended to mean $1 \times 10^{-2}$ or 1% of light is transmitted through the film. The optical density is measured with a Macbeth TD904 optical densitometer. The optical density can be increased by making a thicker coverlay. This is undesirable since the trend is for coverlays to be increasingly thin. The optical density can be increased by adding filler. In some embodiments a pigment is added is increase the optical density. In some embodiments, a matting agent is added to increase the optical density. In some embodiments a combination of pigment and matting agents can be added.

In some embodiments, the pigment is a low conductivity carbon black. In some embodiments, the pigment is a non-carbon black pigment.

Virtually any pigment (or combination of pigments) can be used. In some embodiments, a low conductivity carbon black is used. Low conductivity carbon black is intended to mean, channel type black or furnace black. In some embodiments, the low conductivity carbon black is a surface oxidized carbon black. One method for assessing the extent of surface oxidation (of the carbon black) is to measure the carbon black's volatile content. The volatile content can be measured by calculating weight loss when calcined at 950° C. for 7 minutes. Generally speaking, a highly surface oxidized carbon black (high volatile content) can be readily dispersed into a polyamic acid solution (polyimide precursor), which in turn can be imidized into a (well dispersed) filled polyimide polymer of the present disclosure. It is thought that if the carbon black particles (aggregates) are not in contact with each other, then electron tunneling, electron hopping or other electron flow mechanism are generally suppressed, resulting in lower electrical conductivity. In some embodiments, the low conductivity carbon black has a volatile content greater than or equal to 1%. In some embodiments, the low conductivity carbon black has a volatile content greater than or equal to 5, 9, or 13%. In some embodiments, furnace black may be surface treated to increase the volatile content. In some embodiments a bone black is used.

In some embodiment, the low conductivity carbon black is present in amount between and optionally including any two of the following: 2, 3, 4, 5, 6, 7, 8 and 9 weight percent of the polyimide coverlay. In some embodiments, the first polyimide coverlay comprises a low conductivity carbon black present in an amount from 2 to 9 weight percent. In some embodiments, the second polyimide coverlay comprises a low conductivity carbon black present in an amount from 2 to 9 weight percent. In some embodiments, the first polyimide coverlay and the second polyimide coverlay both comprises a low conductivity carbon black present in an amount from 2 to 9 weight percent.

In some embodiments, the first polyimide coverlay comprises a pigment and a matting agent. In some embodiments, the first polyimide coverlay, the second polyimide coverlay or both comprise a pigment and a matting agent.

In some embodiments, useful non-carbon black pigments include but are not limited to the following: Barium Lemon Yellow, Cadmium Yellow Lemon, Cadmium Yellow Lemon, Cadmium Yellow Light, Cadmium Yellow Middle, Cadmium Yellow Orange, Scarlet Lake, Cadmium Red, Cadmium Vermilion, Alizarin Crimson, Permanent Magenta, Van Dyke brown, Raw Umber Greenish, or Burnt Umber. In some embodiments, useful black pigments include: cobalt oxide, Fe—Mn—Bi black, Fe—Mn oxide spinel black, (Fe,Mn)2O3 black, copper chromite black spinel, lampblack, bone black, bone ash, bone char, hematite, black iron oxide, micaceous iron oxide, black complex inorganic color pigments (CICP), CuCr2O4 black, (Ni,Mn,Co)(Cr,Fe)2O4 black, Aniline black, Perylene black, Anthraquinone black, Chromium Green-Black Hematite, Chrome Iron Oxide, Pigment Green 17, Pigment Black 26, Pigment Black 27, Pigment Black 28, Pigment Brown 29, Pigment Black 30, Pigment Black 32, Pigment Black 33 or mixtures thereof.

In some embodiments, the first polyimide coverlay comprises a non-carbon black pigment present in an amount from 10 to 60 weight percent. In some embodiments, the second polyimide coverlay comprises a non-carbon black pigment present in an amount from 10 to 60 weight percent. In some embodiments, the first polyimide coverlay, the second polyimide coverlay or both comprise a non-carbon black pigment present in an amount from 10 to 60 weight percent. In some embodiments, the first polyimide coverlay comprises a non-carbon black pigment present in an amount between and including any two of the following: 10, 20, 30, 40, 50 and 60 weight percent. In some embodiments, the second polyimide coverlay comprises a non-carbon black pigment present in an amount between and including any two of the following: 10, 20, 30, 40, 50 and 60 weight percent.

In some embodiments, the first polyimide coverlay comprises a low conductivity carbon black present in an amount from 2 to 9 weight percent and the second polyimide coverlay comprises a non-carbon black pigment present in an amount from 10 to 60 weight percent.

A uniform dispersion of isolated, individual particles (aggregates) not only decreases the electrical conductivity, but additionally tends to produce uniform color intensity. In some embodiments the low conductivity carbon black is milled. In some embodiments, the mean particle size of the low conductivity carbon black is between (and optionally including) any two of the following sizes: 0.2, 0.3, 0.4, 0.5, 0.6, 0.7, 0.8, 0.9 and 1.0 microns.

In some embodiments, dyes may be used. Examples of useful dye are, but not limited to nigrosin black, monoazo chromium complex black, or mixtures thereof. In some embodiments, a mixture of dye and pigment may be used.

In some embodiments it is desirable to have a coverlay with a matte appearance. Polymeric materials typically have inherent surface gloss. To control gloss (and thereby produce matte surface characteristics) various additive approaches are possible to achieve dull and low gloss surface characteristics. Broadly speaking, the additive approaches are all based upon the same fundamental physics—to create a modified surface which is (on a micro-scale) coarse and irregular shaped and therefore allows less light to be reflected back to the distant (e.g., greater than 50 centimeters) observer. When multiple rays of light hit a glossy surface, most of the light is reflected with similar angle and therefore a relatively high level of light reflectance can be observed. When the same source of light hits a matte (ie. irregular) surface, the light is scattered in many different directions and also a much higher fraction is absorbed. Hence on rough surfaces, light tends to be diffusely scattered in all directions, and the image forming qualities are largely diminished (reflected objects no longer appear brilliant, but blurred).

Gloss meters used to characterize a specific surface for gloss level are based on this same principle. Typically, a light source hits a surface at a fixed angle and after reflection the amount of reflected light is read by a photo cell. Reflection can be read at multiple angles. Maximum gloss performance for a perfectly glossy surface tends to demonstrate 100% reflection, whereas a fully dull surface tends to demonstrate 0% reflection.

Silicas are inorganic particles that can be ground and filtered to specific particle size ranges. The very irregular shape and porosity of silica particles and low cost make it a popular matting agent. Other potential matting agents can include: i. other ceramics, such as, borides, nitrides, carbides and other oxides (e.g., alumina, titania, etc); and ii. organic particles, provided the organic particle can withstand the high temperature processing of a chemically converted polyimide (processing temperatures of from about 250° C. to about 550° C., depending upon the particular polyimide process chosen). One organic matting agent that can withstand the thermal conditions of polyimide synthesis are polyimide particles. In some embodiments, the matting agent is polyimide particles. In some embodiments, the first polyimide coverlay comprises polyimide particles. In some embodiments, the second polyimide coverlay comprises polyimide particles. In some embodiments, both the first polyimide coverlay and the second polyimide coverlay comprise polyimide particles.

The amount of matting agent, median particle size and density must be sufficient to produce the desired 60 degree gloss value. In some embodiments, the 60 degree gloss value is between and optionally including any two of the following: 2, 5, 10, 15, 20, 25, 30 and 35. In some embodiments, the 60 degree gloss value is from 10 to 35. In some embodiments, the 60 degree gloss value is from 2 to 25. The 60 degree gloss value is measured using Micro-TRI-Gloss gloss meter.

In some embodiments, the matting agent is present in an amount between and optionally including any two of the following: 1.6, 2, 3, 4, 5, 6, 7, 8, 9 and 10 weight percent of the first polyimide coverlay or the second polyimide coverlay. In some embodiments, the matting agent has a median particle size between and optionally including any two of the following: 1.3, 2, 3, 4, 5, 6, 7, 8, 9 and 10 microns. The matting agent particles should have an average particle size of less than (or equal to) about 10 microns and greater than (or equal to) about 1.3 microns. Larger matting agent particles may negatively impact mechanical properties. In some embodiments, the matting agent has a density between and optionally including any two of the following: 2, 3, 4 and 4.5 g/cc. In some embodiments, the matting agent is selected from the group consisting of silica, alumina, barium sulfate and mixtures thereof.

In some embodiments, the first polyimide coverlay comprises a pigment and a matting agent. In some embodiments, the pigment and the matting agent are both a low conductivity carbon black and in such embodiments, the low conductivity carbon black is present in the first polyimide coverlay in an amount from 2 to 20 weight percent. In some embodiments, the pigment and the matting agent are both a low conductivity carbon black and in such embodiments, the low conductivity carbon black is present in the first polyimide coverlay in an amount between and including any two of the following: 2, 5, 10, 15 and 20 weight percent. In some embodiments, the pigment and the matting agent are both a low conductivity carbon black and in such embodiments, the low conductivity carbon black is present in the second polyimide coverlay in an amount between and including any two of the following: 2, 5, 10, 15 and 20 weight percent.

In some embodiments, the second polyimide coverlay comprises a pigment and a matting agent. In some embodiments, the pigment and the matting agent in both the first polyimide coverlay and the second polyimide coverlay are a low conductivity carbon black and the low conductivity carbon black is present in the first polyimide coverlay in an amount from 2 to 20 weight percent and the low conductivity carbon black is present in the second polyimide coverlay in an amount from 2 to 20 weight percent. In some embodiments, the pigment and the matting agent are both a low conductivity carbon black and the low conductivity carbon black is present in the first polyimide coverlay in an amount from 2 to 20 weight percent. In some embodiments, the pigment and the matting agent are both a low conductivity carbon black and the low conductivity carbon black is present in the first polyimide coverlay, the second polyimide coverlay or both in an amount from 2 to 20 weight percent.

In some embodiments, the first polyimide coverlay comprises a low conductivity carbon black present in an amount from 2 to 9 weight percent and the second polyimide coverlay comprises a non-carbon black pigment present in an amount from 10 to 60 weight percent.

In another embodiment, the first polyimide coverlay comprises a low conductivity carbon black present in an amount from 2 to 9 weight percent and the second polyimide coverlay comprises a pigment and a matting agent. In another embodiment, the pigment and the matting agent in the second polyimide coverlay are both a low conductivity carbon black, the carbon black present in an amount from 2 to 20 weight percent.

In another embodiment, the first polyimide coverlay comprises a low conductivity carbon black present in an amount from 2 to 9 weight percent and the second polyimide coverlay comprises a pigment and a matting agent, and wherein the matting agent is polyimide particles.

In another embodiment, the first polyimide coverlay is derived from 100 mole % 3,3',4,4'-biphenyl tetracarboxylic dianhydride, and 100 mole % 2,2'-bis(trifluoromethyl) benzidine; In such an embodiment, the circuit board comprises
  a. a first electrically insulating layer having a first side and a second side;
  b. a first imaged metal layer;
  c. a first polyimide coverlay derived from 100 mole % 3,3',4,4'-biphenyl tetracarboxylic dianhydride, and 100 mole % 2,2'-bis(trifluoromethyl) benzidine and in direct contact with the first imaged metal layer and exposed areas of the first side of the electrically insulating layer. An adhesive layer is not present between the first imaged metal layer and the first polyimide coverlay. The first polyimide coverlay has a peel strength from 1 to 2 N/mm, as measured in accordance with IPC-TM-650-2.4.9d, when the first polyimide coverlay is laminated to the first imaged metal layer and the exposed areas of the first side of the first electrically insulating layer at a lamination temperature from 380 to 400° C. and a pressure from 150 psi (10.55 Kg/cm) to 400 psi (28.13 Kg/cm) and the first electrically insulating layer is any electrically insulating material that can withstand the lamination temperature from 380 to 400° C.

In some embodiments, circuit board further comprises a second polyimide coverlay derived from 100 mole % 3,3',4,4'-biphenyl tetracarboxylic dianhydride, and 100 mole % 2,2'-bis(trifluoromethyl) benzidine. In such embodiments, the circuit board comprises
  a. a second polyimide coverlay derived from 100 mole % 3,3',4,4'-biphenyl tetracarboxylic dianhydride, and 100 mole % 2,2'-bis(trifluoromethyl) benzidine and in direct contact with the second imaged metal layer and exposed areas of the second side of the first electrically insulating layer.
  b. a second imaged metal layer
  c. a first electrically insulating layer having a first side and a second side;
  d. a first imaged metal layer;
  e. a first polyimide coverlay derived from 100 mole % 3,3',4,4'-biphenyl tetracarboxylic dianhydride, and 100 mole % 2,2'-bis(trifluoromethyl) benzidine, and in direct contact with the first imaged metal layer and exposed areas of the first side of the first electrically insulating layer.
An adhesive layer is not present between the first imaged metal layer and the first polyimide coverlay and an adhesive layer is not present between the second imaged metal layer and the second polyimide coverlay. The first polyimide coverlay has a peel strength from 1 to 2 N/mm, as measured in accordance with IPC-TM-650-2.4.9d, when the polyimide coverlay is laminated to the first imaged metal layer and exposed areas of the first side of the first electrically insulating layer at a lamination temperature from 380 to 400° C. and a pressure from 150 psi (10.55 Kg/cm) to 400 psi (28.13 Kg/cm) and the first electrically insulating layer is any electrically insulating material that can withstand the lamination temperature from 380 to 400° C.

Electrically Insulating Layer—Circuit Board Coverlay

In some embodiments, the first electrically insulating layer is any electrically insulating material that can withstand the lamination temperature from 300 to 400° C.; in some embodiments 300 to 380° C. or in other embodiments 320 to 380° C. In some embodiments, the first electrically insulating layer is derived from a polyimide. In some embodiments, the first electrically insulating layer is derived from an aromatic polyimide.

In some embodiments, the first electrically insulating layer is derived from 100 mole % 3,3',4,4'-biphenyl tetracarboxylic dianhydride, 20 to 90 mole % 2,2'-bis(trifluoromethyl) benzidine and 10 to 80 mole % 4,4'-oxydianiline.

In some embodiments the first electrically insulating layer is derived from 100 mole % 3,3',4,4'-biphenyl tetracarboxylic dianhydride, 40 to 90 mole % 2,2'-bis(trifluoromethyl) benzidine In some embodiments the first electrically insulating layer is derived from 100 mole % 3,3',4,4'-biphenyl tetracarboxylic dianhydride, 100 mole % 2,2'-bis(trifluoromethyl) benzidine.

In some embodiments the first electrically insulating layer is derived from 100 mole % 3,3',4,4'-biphenyl tetracarboxylic dianhydride, 20 to 30 mole % 2,2'-bis(trifluoromethyl) benzidine.

In some embodiments, the first electrically insulating layer is derived from 100 mole % 3,3',4,4'-biphenyl tetracarboxylic dianhydride, between and including any two of the following: 20, 30, 40, 45, 50, 55, 60, 65, 70, 75, 80, 85 and 90 mole % 2,2'-bis(trifluoromethyl) benzidine, and between and including any two of the following: 10, 15, 20, 25, 30, 35, 40, 45, 50, 55 60, 70 and 80 mole % 4,4'-oxydianiline.

In some embodiments, the first electrically insulating layer comprises from 1 to 55 weight percent of a thermally conductive filler, a dielectric filler or mixtures thereof.

Imaged Metal Layers—Circuit Board Coverlay

In some embodiments, the first imaged metal layer is copper. In some embodiments, the first imaged metal layer, the second imaged layer or both are copper. In some embodiments, the first imaged metal layer is elemental metal. In some embodiments, the first imaged metal layer is a metal alloy. In some embodiments, the first imaged metal layer is aluminum.

In some embodiments, the second imaged metal layer is elemental metal. In some embodiments, the second imaged metal layer is a metal alloy. In some embodiments, the second imaged metal layer is copper. In some embodiments, the second imaged metal layer is aluminum.

In some embodiments, both the first imaged metal layer and the second imaged metal layer are elemental metal. In some embodiments, both the first imaged metal layer and the second imaged metal layer are a metal alloy. In some embodiments, the first imaged metal layer and the second imaged metal layer are copper.

In some embodiments, the metal alloy comprises 50 to 72 weight % nickel. In another embodiment, the metal alloy comprises 50 to 72% weight % nickel and 14 to 24 weight % Chromium. In some embodiments, the metal foil is aluminum.

In some embodiments, the first imaged metal layer is from 5 to 72 microns thick. In some embodiments, the first imaged metal layer is between and including any two of the following: 5, 10, 15, 20, 25, 30, 35, 40, 45, 50, 55, 60, 65, 70 and 72 microns thick. In some embodiments, the first imaged metal layer is surface treated to improve adhesion to electrically insulating layers.

In some embodiments, the second imaged metal layer is from 5 to 72 microns thick. In some embodiments, the second imaged metal layer is between and including any two of the following: 5, 10, 15, 20, 25, 30, 35, 40, 45, 50, 55, 60, 65, 70 and 72 microns thick. In some embodiments, the second imaged metal layer is surface treated to improve adhesion to electrically insulating layers.

In some embodiments, the first imaged metal layer and the second imaged metal layer are made by imaging a metal foil/metal layer with a photoresist and copper etching to created imaged metal layers having lines of different widths using standard procedures in the flexible printed circuit board industry.

In some embodiments, the first electrically insulating layer comprises from 1 to 55 weight percent of a thermally conductive filler, a dielectric filler or mixtures thereof, the first imaged metal layer is copper and wherein the first polyimide coverlay comprises: a low conductivity carbon black present in an amount from 2 to 9 weight percent or a non-carbon black pigment present in an amount from 10 to 60 weight percent.

In another embodiment, the first electrically insulating layer comprises from 1 to 55 weight percent of a thermally conductive filler, a dielectric filler or mixtures thereof; the first imaged metal layer is copper and wherein the first polyimide coverlay comprises a pigment and a matting agent, wherein the pigment and the matting agent are both a low conductivity carbon black, the low conductivity carbon black is present in the first polyimide coverlay in an amount from 2 to 20 weight percent.

In another embodiment, the first electrically insulating layer comprises from 1 to 55 weight percent of a thermally conductive filler, a dielectric filler or mixtures thereof; the first imaged metal layer is copper and wherein the first polyimide coverlay comprises a pigment and a matting agent, wherein the matting agent is polyimide particles.

In some embodiments, the first electrically insulating layer comprises from 1 to 55 weight percent of a thermally conductive filler, a dielectric filler or mixtures thereof and the first imaged metal layer, the second imaged metal layer or both are copper.

In some embodiments, the first electrically insulating layer comprises from 1 to 55 weight percent of a thermally conductive filler, a dielectric filler or mixtures thereof. In some embodiments, the first electrically insulating layer comprises from 1 to 55 weight percent of a thermally conductive filler, a dielectric filler or mixtures thereof and the first imaged metal layer is copper. In some embodiments, first the electrically insulating layer comprises between and including any two of the following: 1, 5, 10, 15, 20, 25, 30, 35, 40, 45, 50 and 55 weight percent of a thermally conductive filler, a dielectric filler or mixtures thereof. In some embodiments, the first electrically insulating layer comprises between and including any two of the following: 1, 5, 10, 15, 20, 25, 30, 35, 40, 45, 50 and 55 weight percent of a thermally conductive filler, a dielectric filler or mixtures thereof and the first imaged metal layer is copper.

In some embodiments of the present disclosure, the circuit board comprises:

a. a second polyimide coverlay derived from 100 mole % 3,3',4,4'-biphenyl tetracarboxylic dianhydride, 20 to 90 mole % 2,2'-bis(trifluoromethyl) benzidine, and 10 to 80 mole % 4,4'-oxydianiline and in direct contact with the second imaged metal layer and exposed areas of the second side of the first electrically insulating layer. An adhesive layer is not present between the second imaged metal layer and the second polyimide coverlay. The second polyimide coverlay has a peel strength from 0.7 to 2 N/mm, as measured in accordance with IPC-TM-650-2.4.9d, when the second polyimide coverlay is laminated to the second imaged metal layer and the exposed areas of the second side of the first electrically insulating layer at a lamination temperature from 300 to 380° C. and a pressure from 150 psi (10.55 Kg/cm) to 400 psi (28.13 Kg/cm);

b. a second imaged metal layer;

c. a first electrically insulating layer having a first side and a second side;

d. a first imaged metal layer;

e. a first polyimide coverlay derived from 100 mole % 3,3',4,4'-biphenyl tetracarboxylic dianhydride, 20 to 90 mole % 2,2'-bis(trifluoromethyl) benzidine, and 10 to 80 mole % 4,4'-oxydianiline and in direct contact with the first imaged metal layer and exposed areas of the first side of the first electrically insulating layer. An adhesive layer is not present between the first imaged metal layer and the first polyimide coverlay. The first polyimide coverlay has a peel strength from 0.7 to 2 N/mm, as measured in accordance with IPC-TM-650-2.4.9d, when the first polyimide coverlay is laminated to the first imaged metal layer and exposed areas of the first side of the first electrically insulating layer at a lamination temperature from 300 to 380° C. and a pressure from 150 psi (10.55 Kg/cm) to 400 psi (28.13 Kg/cm). The first electrically insulating layer is any electrically insulating material that can withstand the lamination temperature from 300 to 380° C.

In some embodiments of the present disclosure, the circuit board comprises:

a. a second polyimide coverlay derived from 100 mole % 3,3',4,4'-biphenyl tetracarboxylic dianhydride, 20 to 90 mole % 2,2'-bis(trifluoromethyl) benzidine, and 10 to 80 mole % 4,4'-oxydianiline and in direct contact with the second imaged metal layer and exposed areas of the second side of the first electrically insulating layer. An adhesive layer is not present between the second imaged metal layer and the second polyimide coverlay. The second polyimide coverlay has a peel strength from 0.7 to 2 N/mm, as measured in accordance with IPC-TM-650-2.4.9d, when the second polyimide coverlay is laminated to the second imaged metal layer and the exposed areas of the second side of the first electrically insulating layer at a lamination temperature from 300 to 380° C. and a pressure from 150 psi (10.55 Kg/cm) to 400 psi (28.13 Kg/cm);

b. a second imaged metal layer;

c. a first electrically insulating layer having a first side and a second side; the first electrically insulating layer is derived from 100 mole % 3,3',4,4'-biphenyl tetracarboxylic dianhydride, 20 to 90 mole % 2,2'-bis(trifluoromethyl) benzidine, and 10 to 80 mole % 4,4'-oxydianiline or is derived from 100 mole % 3,3',4,4'-biphenyl tetracarboxylic dianhydride 100 mole % 2,2'-bis(trifluoromethyl) benzidine.

d. a first imaged metal layer;

e. a first polyimide coverlay derived from 100 mole % 3,3',4,4'-biphenyl tetracarboxylic dianhydride, 20 to 90 mole % 2,2'-bis(trifluoromethyl) benzidine, and 10 to 80 mole %

4,4'-oxydianiline and in direct contact with the first imaged metal layer and exposed areas of the first side of the first electrically insulating layer. An adhesive layer is not present between the first imaged metal layer and the first polyimide coverlay. The first polyimide coverlay has a peel strength from 0.7 to 2 N/mm, as measured in accordance with IPC-TM-650-2.4.9d, when the first polyimide coverlay is laminated to the first imaged metal layer and exposed areas of the first side of the first electrically insulating layer at a lamination temperature from 300 to 380° C. and a pressure from 150 psi (10.55 Kg/cm) to 400 psi (28.13 Kg/cm). The first electrically insulating layer is any electrically insulating material that can withstand the lamination temperature from 300 to 380° C.

In some embodiments of the present disclosure, the circuit board comprises:
  a. a second polyimide coverlay derived from 100 mole % 3,3',4,4'-biphenyl tetracarboxylic dianhydride, 40 to 90 mole % 2,2'-bis(trifluoromethyl) benzidine, and 10 to 60 mole % 4,4'-oxydianiline and in direct contact with the second imaged metal layer and exposed areas of the second side of the first electrically insulating layer. An adhesive layer is not present between the second imaged metal layer and the second polyimide coverlay. The second polyimide coverlay has a peel strength from 1 to 2 N/mm, as measured in accordance with IPC-TM-650-2.4.9d, when the second polyimide coverlay is laminated to the second imaged metal layer and the exposed areas of the second side of the first electrically insulating layer at a lamination temperature from 320 to 380° C. and a pressure from 150 psi (10.55 Kg/cm) to 400 psi (28.13 Kg/cm);
  b. a second imaged metal layer;
  c. a first electrically insulating layer having a first side and a second side;
  d. a first imaged metal layer;
  e. a first polyimide coverlay derived from 100 mole % 3,3',4,4'-biphenyl tetracarboxylic dianhydride, 40 to 90 mole % 2,2'-bis(trifluoromethyl) benzidine, and 10 to 60 mole % 4,4'-oxydianiline and in direct contact with the first imaged metal layer and exposed areas of the first side of the first electrically insulating layer. An adhesive layer is not present between the first imaged metal layer and the first polyimide coverlay. The first polyimide coverlay has a peel strength from 1 to 2 N/mm, as measured in accordance with IPC-TM-650-2.4.9d, when the first polyimide coverlay is laminated to the first imaged metal layer and exposed areas of the first side of the first electrically insulating layer at a lamination temperature from 320 to 3800 and a pressure from 150 psi (10.55 Kg/cm) to 400 psi (28.13 Kg/cm). The first electrically insulating layer is any electrically insulating material that can withstand the lamination temperature from 320 to 3800.

In some embodiments of the present disclosure, the circuit board comprises:
  a. a second polyimide coverlay derived from 100 mole % 3,3',4,4'-biphenyl tetracarboxylic dianhydride, 40 to 90 mole % 2,2'-bis(trifluoromethyl) benzidine, and 10 to 60 mole % 4,4'-oxydianiline and in direct contact with the second imaged metal layer and exposed areas of the second side of the first electrically insulating layer. An adhesive layer is not present between the second imaged metal layer and the second polyimide coverlay. The second polyimide coverlay has a peel strength from 1 to 2 N/mm, as measured in accordance with IPC-TM-650-2.4.9d, when the second polyimide coverlay is laminated to the second imaged metal layer and the exposed areas of the second side of the first electrically insulating layer at a lamination temperature from 320 to 380° C. and a pressure from 150 psi (10.55 Kg/cm) to 400 psi (28.13 Kg/cm);
  b. a second imaged metal layer;
  c. a first electrically insulating layer having a first side and a second side; the first electrically insulating layer is derived from 100 mole % 3,3',4,4'-biphenyl tetracarboxylic dianhydride, 40 to 90 mole % 2,2'-bis(trifluoromethyl) benzidine, and 10 to 60 mole % 4,4'-oxydianiline or is derived from 100 mole % 3,3',4,4'-biphenyl tetracarboxylic dianhydride, 100 mole % 2,2'-bis(trifluoromethyl) benzidine.
  d. a first imaged metal layer;
  e. a first polyimide coverlay derived from 100 mole % 3,3',4,4'-biphenyl tetracarboxylic dianhydride, 40 to 90 mole % 2,2'-bis(trifluoromethyl) benzidine, and 10 to 60 mole % 4,4'-oxydianiline and in direct contact with the first imaged metal layer and exposed areas of the first side of the first electrically insulating layer. An adhesive layer is not present between the first imaged metal layer and the first polyimide coverlay. The first polyimide coverlay has a peel strength from 1 to 2 N/mm, as measured in accordance with IPC-TM-650-2.4.9d, when the first polyimide coverlay is laminated to the first imaged metal layer and exposed areas of the first side of the first electrically insulating layer at a lamination temperature from 320 to 380° C. and a pressure from 150 psi (10.55 Kg/cm) to 400 psi (28.13 Kg/cm). The first electrically insulating layer is any electrically insulating material that can withstand the lamination temperature from 320 to 380° C.

In some embodiments, the first polyimide coverlay and the second polyimide coverlay each independently have a thickness from 5 to 152 microns. In some embodiments, the first polyimide coverlay has a thickness between and including any two of the following: 5, 10, 20, 30, 40, 50, 60, 70, 80, 90, 100, 105, 110, 120, 130, 140 and 152 microns. In some embodiments, the second polyimide coverlay has a thickness between and including any two of the following: 5, 10, 20, 30, 40, 50, 60, 70, 80, 90, 100, 105, 110, 120, 130, 140 and 152 microns. In some embodiments, the first polyimide coverlay and the second polyimide coverlay each independently have a thickness from 5 to 105 micron. In yet another embodiment, the first polyimide coverlay and the second polyimide coverlay each independently have a thickness from 10 to 40 microns.

The polyimide coverlay(s) of the present disclosure can be made by any known thermal conversion or chemical conversion method for making filled polyimides. In some embodiments, it is desirable to use chemical conversion due to the advantages chemical conversion over thermal conversion such as but not limited to, lower CTE and films are matte on both sides even when cast on to a smooth surface.

In some embodiments, the circuit board is made by taking a single-sided clad (electrically insulating layer and an imaged metal layer) and laminating with a first polyimide coverlay at a lamination temperature of 320 to 380° C. and a pressure from 150 psi (10.55 Kg/cm) to 400 psi (28.13 Kg/cm) such that the first polyimide coverlay is in direct contact with the first imaged metal layer and exposed areas of the first side of the first electrically insulating layer.

In some embodiments, the circuit board is made by taking a double-sided clad (first imaged metal layer, first electrically insulating layer and a second imaged metal layer) and laminating with a first polyimide coverlay and a second polyimide coverlay at a lamination temperature of 320 to 380° C. and a pressure from 150 psi (10.55 Kg/cm) to 400 psi (28.13 Kg/cm) such that the first polyimide coverlay is in direct contact with the first imaged metal layer and exposed areas of the first side of the first electrically insulating layer and the second polyimide coverlay is laminated to the second imaged metal layer and the exposed areas of the second side of the first electrically insulating layer.

In some embodiments, a vacuum platen press is used.

Circuit Board—Polyimide Bondply

One embodiment of the present disclosure is a polyimide bondply for a circuit board. In such an embodiment, the circuit board comprises, in the following order:

a. a first imaged metal layer b. a first electrically insulating layer having a first side and a second side; the first side of the first electrically insulating layer is next to the first imaged metal layer c. a second imaged metal layer; the second side of the first electrically insulating layer is next to the second imaged metal layer;

d. a polyimide bondply derived from 100 mole % 3,3',4,4'-biphenyl tetracarboxylic dianhydride, 20 to 90 mole % 2,2'-bis(trifluoromethyl) benzidine, and 10 to 80 mole % 4,4'-oxydianiline;

e. a third imaged metal layer;

f. a second electrically insulating layer having a first side and a second side; the first side of the second electrically insulating layer is next to the third imaged metal layer g. a fourth imaged metal layer; the second side of the second electrically insulating layer is next to the fourth imaged metal layer. The polyimide bondply is in direct contact with the second imaged metal layer and exposed areas of the second side of the first electrically insulating layer and in direct contact with the third imaged metal layer and exposed areas of the first side of the second electrically insulating layer. In some embodiments, the polyimide bondply has a peel strength from 0.7 to 2 N/mm as measured in accordance with IPC-TM-650-2.4.9d, when i) the first imaged metal layer, the first electrically insulating layer and the second image metal layer; and ii) the polyimide bondply;

iii) the third imaged metal layer, the second electrically insulating layer and the fourth imaged metal layer are laminated at a lamination temperature from 300 to 380° C. and a pressure from 150 psi (10.55 Kg/cm) to 400 psi (28.13 Kg/cm). The first electrically insulating layer and the second electrically insulating layer are any electrically insulating material that can withstand the lamination temperature from 300 to 380° C.

Another embodiment of the present disclosure is a polyimide bondply for a circuit board. In such an embodiment, the circuit board comprises, in the following order:

a. a first imaged metal layer b. a first electrically insulating layer having a first side and a second side; the first side of the first electrically insulating layer is next to the first imaged metal layer c. a second imaged metal layer; the second side of the first electrically insulating layer is next to the second imaged metal layer;

d. a polyimide bondply derived from 100 mole % 3,3',4,4'-biphenyl tetracarboxylic dianhydride, 40 to 90 mole % 2,2'-bis(trifluoromethyl) benzidine, and 10 to 60 mole % 4,4'-oxydianiline;

e. a third imaged metal layer;

f. a second electrically insulating layer having a first side and a second side; the first side of the second electrically insulating layer is next to the third imaged metal layer g. a fourth imaged metal layer; the second side of the second electrically insulating layer is next to the fourth imaged metal layer. The polyimide bondply is in direct contact with the second imaged metal layer and exposed areas of the second side of the first electrically insulating layer and in direct contact with the third imaged metal layer and exposed areas of the first side of the second electrically insulating layer. The polyimide bondply has a peel strength from 1 to 2 N/mm as measured in accordance with IPC-TM-650-2.4.9d, when i) the first imaged metal layer, the first electrically insulating layer and the second image metal layer; and ii) the polyimide bondply;

iii) the third imaged metal layer, the second electrically insulating layer and the fourth imaged metal layer are laminated at a lamination temperature from 320 to 380° C. and a pressure from 150 psi (10.55 Kg/cm) to 400 psi (28.13 Kg/cm). The first electrically insulating layer and the second electrically insulating layer are any electrically insulating material that can withstand the lamination temperature from 320 to 380° C.

In some embodiments, the polyimide bondply is derived from 100 mole % 3,3',4,4'-biphenyl tetracarboxylic dianhydride, between and including any two of the following: 20, 30, 40, 45, 50, 55, 60, 65, 70, 75, 80, 85 and 90 mole % 2,2'-bis(trifluoromethyl) benzidine, and between and including any two of the following: 10, 15, 20, 25, 30, 35, 40, 45, 50, 55, 60, 70 and 80 mole % 4,4'-oxydianiline.

In some embodiments, the polyimide bondply comprises from 1 to 55 weight percent of a thermally conductive filler, dielectric filler or mixtures thereof. In some embodiments, the polyimide bondply comprises between and including any two of the following: 1, 5, 10, 15, 20, 25, 30, 35, 40, 45, 50 and 55 weight percent of a thermally conductive filler, a dielectric filler or mixtures thereof.

In another embodiment, the polyimide bondply is derived from 100 mole % 3,3',4,4'-biphenyl tetracarboxylic dianhydride, and 100 mole % 2,2'-bis(trifluoromethyl) benzidine and can be laminated at a lamination temperature from 380 to 400° C. and a pressure from 150 psi (10.55 Kg/cm) to 400 psi (28.13 Kg/cm).

Electrically Insulating Layers—Circuit Board Bondply

In some embodiments, the first electrically insulating layer is any electrically insulating material that can withstand the lamination temperature from 300 to 380° C. In some embodiments, the first electrically insulating layer is derived from a polyimide. In some embodiments, the first electrically insulating layer is derived from an aromatic polyimide.

In some embodiments, the second electrically insulating layer is any electrically insulating material that can withstand the lamination temperature from 300 to 380° C. In some embodiments, the second electrically insulating layer is derived from a polyimide. In some embodiments, the second electrically insulating layer is derived from an aromatic polyimide.

In one embodiment, the first electrically insulating layer and the second electrically insulating layer are any electrically insulating material that can withstand the lamination temperature from 320 to 380° C.

In some embodiments, the first electrically insulating layer is derived from 100 mole % 3,3',4,4'-biphenyl tetracarboxylic dianhydride, 20 to 90 mole % 2,2'-bis(trifluoromethyl) benzidine and 10 to 80 mole % 4,4'-oxydianiline.

In some embodiments the first electrically insulating layer is derived from 100 mole % 3,3',4,4'-biphenyl tetracarboxylic dianhydride, 40 to 90 mole % 2,2'-bis(trifluoromethyl) benzidine In some embodiments the first electrically insulating layer is derived from 100 mole % 3,3',4,4'-biphenyl tetracarboxylic dianhydride, 100 mole % 2,2'-bis(trifluoromethyl) benzidine.

In some embodiments the first electrically insulating layer is derived from 100 mole % 3,3',4,4'-biphenyl tetracarboxylic dianhydride, 20 to 30 mole % 2,2'-bis(trifluoromethyl) benzidine.

In some embodiments, the first electrically insulating layer, the second electrically insulating layer or both are derived from 100 mole % 3,3',4,4'-biphenyl tetracarboxylic dianhydride, between and including any two of the following: 20, 30, 40, 45, 50, 55, 60, 65, 70, 75, 80, 85 and 90 mole % 2,2'-bis(trifluoromethyl) benzidine, and between and including any two of the following: 10, 15, 20, 25, 30, 35, 40, 45, 50, 55 60, 70 and 80 mole % 4,4'-oxydianiline.

In some embodiments, the first electrically insulating layer is derived from 100 mole % 3,3',4,4'-biphenyl tetracarboxylic dianhydride, 40 to 90 mole % 2,2'-bis(trifluoromethyl) benzidine, and 10 to 60 mole % 4,4'-oxydianiline and is direct contact with first imaged metal layer, the second imaged metal layer and exposed areas of the polyimide bondply.

In some embodiments, the second electrically insulating layer is derived from 100 mole % 3,3',4,4'-biphenyl tetracarboxylic dianhydride, 40 to 90 mole % 2,2'-bis(trifluoromethyl) benzidine, and 10 to 60 mole % 4,4'-oxydianiline and is direct contact with fourth imaged metal layer, the third imaged metal layer and exposed areas of the polyimide bondply.

In some embodiments, the first electrically insulating layer is derived from 100 mole % 3,3',4,4'-biphenyl tetracarboxylic dianhydride, 20 to 90 mole % 2,2'-bis(trifluoromethyl) benzidine, and 10 to 80 mole % 4,4'-oxydianiline and is direct contact with first imaged metal layer, the second imaged metal layer and exposed areas of the polyimide bondply and the second electrically insulating layer is derived from 100 mole % 3,3',4,4'-biphenyl tetracarboxylic dianhydride, 20 to 90 mole % 2,2'-bis(trifluoromethyl) benzidine, and 10 to 80 mole % 4,4'-oxydianiline and is direct contact with fourth imaged metal layer, the third imaged metal layer and exposed areas of the polyimide bondply.

In some embodiments, the first electrically insulating layer is derived from 100 mole % 3,3',4,4'-biphenyl tetracarboxylic dianhydride, 40 to 90 mole % 2,2'-bis(trifluoromethyl) benzidine, and 10 to 60 mole % 4,4'-oxydianiline and is direct contact with first imaged metal layer, the second imaged metal layer and exposed areas of the polyimide bondply and the second electrically insulating layer is derived from 100 mole % 3,3',4,4'-biphenyl tetracarboxylic dianhydride, 40 to 90 mole % 2,2'-bis(trifluoromethyl) benzidine, and 10 to 60 mole % 4,4'-oxydianiline and is direct contact with fourth imaged metal layer, the third imaged metal layer and exposed areas of the polyimide bondply.

In another embodiment, the first electrically insulating layer is derived from 100 mole % 3,3',4,4'-biphenyl tetracarboxylic dianhydride, and 100 mole % 2,2'-bis(trifluoromethyl) benzidine and can be laminated at a lamination temperature from 380 to 400° C. and a pressure from 150 psi (10.55 Kg/cm) to 400 psi (28.13 Kg/cm).

In another embodiment, the second electrically insulating layer is derived from 100 mole % 3,3',4,4'-biphenyl tetracarboxylic dianhydride, and 100 mole % 2,2'-bis(trifluoromethyl) benzidine and can be laminated at a lamination temperature from 380 to 400° C. and a pressure from 150 psi (10.55 Kg/cm) to 400 psi (28.13 Kg/cm).

In some embodiments, the first electrically insulating layer is derived from 100 mole % 3,3',4,4'-biphenyl tetracarboxylic dianhydride, and 100 mole % 2,2'-bis(trifluoromethyl) benzidine and is direct contact with first imaged metal layer, the second imaged metal layer and exposed areas of the polyimide bondply and the second electrically insulating layer is derived from 100 mole % 3,3',4,4'-biphenyl tetracarboxylic dianhydride, and 100 mole % 2,2'-bis(trifluoromethyl) benzidine and is direct contact with fourth imaged metal layer, the third imaged metal layer and exposed areas of the polyimide bondply.

In some embodiments, the first electrically insulating layer comprises from 1 to 55 weight percent of a thermally conductive filler, dielectric fillers or mixtures thereof. In some embodiments, the second electrically insulating layer comprises from 1 to 55 weight percent of a thermally conductive filler, dielectric fillers or mixtures thereof. In some embodiments, the first electrically insulating layer, the second electrically insulating layer or both comprise from 1 to 55 weight percent of a thermally conductive filler, dielectric filler or mixtures thereof.

In some embodiments, the first electrically insulating layer, the second electrically insulating layer or both comprise from 1 to 55 weight percent of a thermally conductive filler, a dielectric filler or mixtures thereof.

Imaged Metal Layers—Circuit Board Bondply

In some embodiments, the first imaged metal layer is elemental metal. In some embodiments, the first imaged metal layer is a metal alloy. In some embodiments, the first imaged metal layer is copper. In some embodiments, the first imaged metal layer is aluminum.

In some embodiments, the second imaged metal layer is elemental metal. In some embodiments, the second imaged metal layer is a metal alloy. In some embodiments, the second imaged metal layer is copper. In some embodiments, the second imaged metal layer is aluminum.

In some embodiments, the third imaged metal layer is elemental metal. In some embodiments, the third imaged metal layer is a metal alloy. In some embodiments, the third imaged metal layer is copper. In some embodiments, the third imaged metal layer is aluminum.

In some embodiments, the fourth imaged metal layer is elemental metal. In some embodiments, the fourth imaged metal layer is a metal alloy. In some embodiments, the fourth imaged metal layer is copper. In some embodiments, the fourth imaged metal layer is aluminum.

In some embodiments, the first imaged metal layer, the second imaged metal layer, the third imaged metal layer and the fourth imaged metal layer are elemental metal. In some embodiments, the first imaged metal layer, the second imaged metal layer, the third imaged metal layer and the fourth imaged metal layer are a metal alloy. In some embodiments, the first imaged metal layer, the second imaged metal layer, the third imaged metal layer and the fourth imaged metal layer are copper. In some embodiments, the first imaged metal layer, the second imaged metal layer, the third imaged metal layer and the fourth imaged metal layer are aluminum.

In some embodiments, the metal alloy comprises 50 to 72 weight % nickel. In another embodiment, the metal alloy comprises 50 to 72% weight % nickel and 14 to 24 weight % Chromium.

In some embodiments, the first imaged metal layer, the second imaged metal layer, the third imaged metal layer and the fourth imaged metal layer are independently from 5 to 72 microns thick. In some embodiments, the first imaged metal layer, the second imaged metal layer, the third imaged metal layer and the fourth imaged metal layer are independently between and including any two of the following: 5, 10, 15, 20, 25, 30, 35, 40, 45, 50, 55, 60, 65, 70 and 72 microns thick. In some embodiments, the first imaged metal layer, the second imaged metal layer, the third imaged metal layer and the fourth imaged metal layer are independently surface treated to improve adhesion to electrically insulating layers.

In some embodiments, the first imaged metal layer, the second imaged metal layer, the third imaged metal layer and the fourth imaged metal layer are made by imaging a metal foil/metal layer with a photoresist and copper etching to created imaged metal layers having lines of different widths using standard procedures in the flexible printed circuit board industry.

In one embodiment, the polyimide bondply comprises from 1 to 55 weight percent of a thermally conductive filler, dielectric fillers or mixtures thereof and the first electrically insulating layer, the second electrically insulating layer or both comprise from 1 to 55 weight percent of a thermally conductive filler, dielectric fillers or mixtures thereof and the first imaged metal layer, the second imaged metal layer, the third imaged metal layer and the fourth imaged metal layer are copper.

In some embodiments, the circuit board comprises, in the following order a. a first imaged metal layer b. a first electrically insulating layer having a first side and a second side; the first side of the first electrically insulating layer is next to the first imaged metal layer and is derived from 100 mole % 3,3',4,4'-biphenyl tetracarboxylic dianhydride, 20 to 90 mole % 2,2'-bis(trifluoromethyl) benzidine, and 10 to 80 mole % 4,4'-oxydianiline;

c. a second imaged metal layer; the second side of the first electrically insulating layer is next to the second imaged metal layer;

d. a polyimide bondply derived from 100 mole % 3,3',4,4'-biphenyl tetracarboxylic dianhydride, 20 to 90 mole % 2,2'-bis(trifluoromethyl) benzidine, and 10 to 80 mole % 4,4'-oxydianiline;

e. a third imaged metal layer;

f. a second electrically insulating layer having a first side and a second side; the first side of the second electrically insulating layer is next to the third imaged metal layer and is derived from 100 mole % 3,3',4,4'-biphenyl tetracarboxylic dianhydride, 20 to 90 mole % 2,2'-bis(trifluoromethyl) benzidine, and 10 to 80 mole % 4,4'-oxydianiline;

g. a fourth imaged metal layer; the second side of the second electrically insulating layer is next to the fourth imaged metal layer. The polyimide bondply is in direct contact with the second imaged metal layer and exposed areas of the second side of the first electrically insulating layer and in direct contact with the third imaged metal layer and exposed areas of the first side of the second electrically insulating layer. The polyimide bondply has a peel strength from 0.7 to 2 N/mm as measured in accordance with IPC-TM-650-2.4.9d, when i) the first imaged metal layer, the first electrically insulating layer and the second image metal layer; and ii) the polyimide bondply;

iii) the third imaged metal layer, the second electrically insulating layer and the fourth imaged metal layer are laminated at a lamination temperature from 300 to 380° C. and a pressure from 150 psi (10.55 Kg/cm) to 400 psi (28.13 Kg/cm).

In some embodiments, the circuit board comprises, in the following order:

a. a first imaged metal layer b. a first electrically insulating layer having a first side and a second side; the first side of the first electrically insulating layer is next to the first imaged metal layer and is derived from 100 mole % 3,3',4,4'-biphenyl tetracarboxylic dianhydride, 40 to 90 mole % 2,2'-bis(trifluoromethyl) benzidine, and 10 to 60 mole % 4,4'-oxydianiline;

c. a second imaged metal layer; the second side of the first electrically insulating layer is next to the second imaged metal layer;

d. a polyimide bondply derived from 100 mole % 3,3',4,4'-biphenyl tetracarboxylic dianhydride, 40 to 90 mole % 2,2'-bis(trifluoromethyl) benzidine, and 10 to 60 mole % 4,4'-oxydianiline;

e. a third imaged metal layer;

f. a second electrically insulating layer having a first side and a second side; the first side of the second electrically insulating layer is next to the third imaged metal layer and is derived from 100 mole % 3,3',4,4'-biphenyl tetracarboxylic dianhydride, 40 to 90 mole % 2,2'-bis(trifluoromethyl) benzidine, and 10 to 60 mole % 4,4'-oxydianiline;

g. a fourth imaged metal layer; the second side of the second electrically insulating layer is next to the fourth imaged metal layer. The polyimide bondply is in direct contact with the second imaged metal layer and exposed areas of the second side of the first electrically insulating layer and in direct contact with the third imaged metal layer and exposed areas of the first side of the second electrically insulating layer. The polyimide bondply has a peel strength from 1 to 2 N/mm as measured in accordance with IPC-TM-650-2.4.9d, when i) the first imaged metal layer, the first electrically insulating layer and the second image metal layer; and ii) the polyimide bondply;

iii) the third imaged metal layer, the second electrically insulating layer and the fourth imaged metal layer are laminated at a lamination temperature from 320 to 380° C. and a pressure from 150 psi (10.55 Kg/cm) to 400 psi (28.13 Kg/cm).

In some embodiments, the circuit board further comprises an adhesive and a first coverlay wherein the adhesive is between and in direct contact with the first imaged metal layer and the exposed areas of the first side of the first electrically insulating layer and the first coverlay. In some embodiments, the circuit board further comprises a second adhesive and a second coverlay wherein the second adhesive is between and in direct contact with the fourth imaged metal layer and the exposed areas of the second side of the second electrically insulating layer and the second coverlay.

In some embodiments, the circuit board further comprises an adhesive and a first coverlay wherein the adhesive is between and in direct contact with the first imaged metal layer and the exposed areas of the first side of the first electrically insulating layer and the first coverlay and a second adhesive and a second coverlay wherein the second adhesive is between and in direct contact with the fourth imaged layer and the exposed areas of the second side of the second electrically insulating layer and the second coverlay.

In one embodiment, the adhesive and the second adhesive can be any traditional adhesive used to bond a coverlay to an imaged metal layer when the coverlay is added after the circuit board is formed. The circuit board can have any number of imaged metal layers and electrically insulating layers. In some embodiments, two imaged metal layers separated by an electrically insulating layer can be called a clad or metal clad. And number of these clads can be adhered to each other via the polyimide bondply of the present disclosure.

In another embodiment, the circuit board, comprises in the following order a. a first polyimide coverlay derived from 100 mole % 3,3',4,4'-biphenyl tetracarboxylic dianhydride, 20 to 90 mole % 2,2'-bis(trifluoromethyl) benzidine, and 10 to 80 mole % 4,4'-oxydianiline;

b. a first imaged metal layer c. a first electrically insulating layer having a first side and a second side; the first side of the first electrically insulating layer is next to the first imaged metal layer d. a second imaged metal layer; the second side of the first electrically insulating layer is next to the second imaged metal layer;

e. a polyimide bondply derived from 100 mole % 3,3',4,4'-biphenyl tetracarboxylic dianhydride, 20 to 90 mole % 2,2'-bis(trifluoromethyl) benzidine, and 10 to 80 mole % 4,4'-oxydianiline;

f. a third imaged metal layer;

g. a second electrically insulating layer having a first side and a second side; the first side of the second electrically insulating layer is next to the third imaged metal layer h. a fourth imaged metal layer; the second side of the second electrically insulating layer is next to the fourth imaged metal layer;

i. a second polyimide coverlay derived from 100 mole % 3,3',4,4'-biphenyl tetracarboxylic dianhydride, 20 to 90 mole % 2,2'-bis(trifluoromethyl) benzidine, and 10 to 80 mole % 4,4'-oxydianiline. The polyimide bondply is in direct contact with the second imaged metal layer and exposed areas of the second side of the first electrically insulating layer and in direct contact with the third imaged metal layer and exposed areas of the first side of the second electrically insulating layer. The polyimide bondply has a peel strength from 0.7 to 2 N/mm as measured in accordance with IPC-TM-650-2.4.9d, when i) the first imaged metal layer, the first electrically insulating layer and the second image metal layer;

ii) the polyimide bondply;

iii) the third imaged metal layer, the second electrically insulating layer and the fourth imaged metal layer are laminated at a lamination temperature from 300 to 380° C. and a pressure from 150 psi (10.55 Kg/cm) to 400 psi (28.13 Kg/cm). The first polyimide coverlay is in direct contact with the first imaged metal layer and exposed areas of the first side of the first electrically insulating layer and wherein the second polyimide coverlay is in direct contact with the fourth imaged metal layer and exposed areas of the second side of the second electrically insulating layer and the first electrically insulating layer and the second electrically insulating layer are any electrically insulating material that can withstand the lamination temperature from 300 to 380° C.

In another embodiment, the circuit board, comprises in the following order:

a. a first polyimide coverlay derived from 100 mole % 3,3',4,4'-biphenyl tetracarboxylic dianhydride, 40 to 90 mole % 2,2'-bis(trifluoromethyl) benzidine, and 10 to 60 mole % 4,4'-oxydianiline;

b. a first imaged metal layer c. a first electrically insulating layer having a first side and a second side; the first side of the first electrically insulating layer is next to the first imaged metal layer d. a second imaged metal layer; the second side of the first electrically insulating layer is next to the second imaged metal layer e. a polyimide bondply derived from 100 mole % 3,3',4,4'-biphenyl tetracarboxylic dianhydride, 40 to 90 mole % 2,2'-bis(trifluoromethyl) benzidine, and 10 to 60 mole % 4,4'-oxydianiline;

f. a third imaged metal layer;

g. a second electrically insulating layer having a first side and a second side; the first side of the second electrically insulating layer is next to the third imaged metal layer h. a fourth imaged metal layer; the second side of the second electrically insulating layer is next to the fourth imaged metal layer;

i. a second polyimide coverlay derived from 100 mole % 3,3',4,4'-biphenyl tetracarboxylic dianhydride, 40 to 90 mole % 2,2'-bis(trifluoromethyl) benzidine, and 10 to 60 mole % 4,4'-oxydianiline. The polyimide bondply is in direct contact with the second imaged metal layer and exposed areas of the second side of the first electrically insulating layer and in direct contact with the third imaged metal layer and exposed areas of the first side of the second electrically insulating layer. The polyimide bondply has a peel strength from 1 to 2 N/mm as measured in accordance with IPC-TM-650-2.4.9d, when i) the first imaged metal layer, the first electrically insulating layer and the second image metal layer;

ii) the polyimide bondply;

iii) the third imaged metal layer, the second electrically insulating layer and the fourth imaged metal layer are laminated at a lamination temperature from 320 to 380° C. and a pressure from 150 psi (10.55 Kg/cm) to 400 psi (28.13 Kg/cm).

The first polyimide coverlay is in direct contact with the first imaged metal layer and exposed areas of the first side of the first electrically insulating layer and wherein the second polyimide coverlay is in direct contact with the fourth imaged metal layer and exposed areas of the second side of the second electrically insulating layer and the first electrically insulating layer and the second electrically insulating layer are any electrically insulating material that can withstand the lamination temperature from 320 to 380° C.

In another embodiment, the circuit board, comprising in the following order:

a. a first polyimide coverlay derived from 100 mole % 3,3',4,4'-biphenyl tetracarboxylic dianhydride, 40 to 90 mole % 2,2'-bis(trifluoromethyl) benzidine, and 10 to 60 mole % 4,4'-oxydianiline;

b. a first imaged copper layer c. a first electrically insulating layer having a first side and a second side; the first side of the first electrically insulating layer is next to the first imaged copper layer d. a second imaged copper layer; the second side of the first electrically insulating layer is next to the second imaged copper layer;

e. a polyimide bondply derived from 100 mole % 3,3',4,4'-biphenyl tetracarboxylic dianhydride, 40 to 90 mole % 2,2'-bis(trifluoromethyl) benzidine, and 10 to 60 mole % 4,4'-oxydianiline;

f. a third imaged copper layer;

g. a second electrically insulating layer having a first side and a second side; the first side of the second electrically insulating layer is next to the third imaged copper layer h. a fourth imaged copper layer; the second side of the second electrically insulating layer is next to the fourth imaged copper layer;

i. a second polyimide coverlay derived from 100 mole % 3,3',4,4'-biphenyl tetracarboxylic dianhydride, 40 to 90 mole % 2,2'-bis(trifluoromethyl) benzidine, and 10 to 60 mole % 4,4'-oxydianiline. The polyimide bondply is in direct contact with the second imaged copper layer and exposed areas of the second side of the first electrically insulating layer; and in direct contact with the third imaged copper layer and exposed areas of the first side of the second electrically insulating layer.

In another embodiment, the circuit board, comprising in the following order:

a. a first polyimide coverlay derived from 100 mole % 3,3',4,4'-biphenyl tetracarboxylic dianhydride, 20 to 90 mole % 2,2'-bis(trifluoromethyl) benzidine, and 10 to 80 mole % 4,4'-oxydianiline;

b. a first imaged metal layer c. a first electrically insulating layer having a first side and a second side; the first side of the first electrically insulating layer is next to the first imaged metal layer and is derived from 100 mole % 3,3',4,4'-biphenyl tetracarboxylic dianhydride, 20 to 90 mole % 2,2'-bis(trifluoromethyl) benzidine, and 10 to 80 mole % 4,4'-oxydianiline;

d. a second imaged metal layer; the second side of the first electrically insulating layer is next to the second imaged metal layer;

e. a polyimide bondply derived from 100 mole % 3,3',4,4'-biphenyl tetracarboxylic dianhydride, 20 to 90 mole % 2,2'-bis(trifluoromethyl) benzidine, and 10 to 80 mole % 4,4'-oxydianiline;

f. a third imaged metal layer;

g. a second electrically insulating layer having a first side and a second side; the first side of the second electrically insulating layer is next to the third imaged metal layer and is derived from 100 mole % 3,3',4,4'-biphenyl tetracarboxylic dianhydride, 20 to 90 mole % 2,2'-bis(trifluoromethyl) benzidine, and 10 to 80 mole % 4,4'-oxydianiline h. a fourth imaged metal layer; the second side of the second electrically insulating layer is next to the fourth imaged metal layer;

i. a second polyimide coverlay derived from 100 mole % 3,3',4,4'-biphenyl tetracarboxylic dianhydride, 20 to 90 mole % 2,2'-bis(trifluoromethyl) benzidine, and 10 to 80 mole % 4,4'-oxydianiline. The polyimide bondply is in direct contact with the second imaged metal layer and exposed areas of the second side of the first electrically insulating layer; and in direct contact with the third imaged metal layer and exposed areas of the first side of the second electrically insulating layer. The polyimide bondply has a peel strength from 0.7 to 2 N/mm as measured in accordance with IPC-TM-650-2.4.9d, when i) the first imaged metal layer, the first electrically insulating layer and the second image metal layer;

ii) the polyimide bondply;

iii) the third imaged metal layer, the second electrically insulating layer and the fourth imaged metal layer are laminated at a lamination temperature from 300 to 380° C. and a pressure from 150 psi (10.55 Kg/cm) to 400 psi (28.13 Kg/cm).

In another embodiment, the circuit board, comprising in the following order:

a. a first polyimide coverlay derived from 100 mole % 3,3',4,4'-biphenyl tetracarboxylic dianhydride, 40 to 90 mole % 2,2'-bis(trifluoromethyl) benzidine, and 10 to 60 mole % 4,4'-oxydianiline;

b. a first imaged metal layer c. a first electrically insulating layer having a first side and a second side; the first side of the first electrically insulating layer is next to the first imaged metal layer and is derived from 100 mole % 3,3',4,4'-biphenyl tetracarboxylic dianhydride, 40 to 90 mole % 2,2'-bis(trifluoromethyl) benzidine, and 10 to 60 mole % 4,4'-oxydianiline;

d. a second imaged metal layer; the second side of the first electrically insulating layer is next to the second imaged metal layer;

e. a polyimide bondply derived from 100 mole % 3,3',4,4'-biphenyl tetracarboxylic dianhydride, 40 to 90 mole % 2,2'-bis(trifluoromethyl) benzidine, and 10 to 60 mole % 4,4'-oxydianiline;

f. a third imaged metal layer;

g. a second electrically insulating layer having a first side and a second side; the first side of the second electrically insulating layer is next to the third imaged metal layer and is derived from 100 mole % 3,3',4,4'-biphenyl tetracarboxylic dianhydride, 40 to 90 mole % 2,2'-bis(trifluoromethyl) benzidine, and 10 to 60 mole % 4,4'-oxydianiline h. a fourth imaged metal layer, the second side of the second electrically insulating layer is next to the fourth imaged metal layer;

i. a second polyimide coverlay derived from 100 mole % 3,3',4,4'-biphenyl tetracarboxylic dianhydride, 40 to 90 mole % 2,2'-bis(trifluoromethyl) benzidine, and 10 to 60 mole % 4,4'-oxydianiline. The polyimide bondply is in direct contact with the second imaged metal layer and exposed areas of the second side of the first electrically insulating layer; and in direct contact with the third imaged metal layer and exposed areas of the first side of the second electrically insulating layer. The polyimide bondply has a peel strength from 1 to 2 N/mm as measured in accordance with IPC-TM-650-2.4.9d, when i) the first imaged metal layer, the first electrically insulating layer and the second image metal layer;

ii) the polyimide bondply;

iii) the third imaged metal layer, the second electrically insulating layer and the fourth imaged metal layer are laminated at a lamination temperature from 320 to 380° C. and a pressure from 150 psi (10.55 Kg/cm) to 400 psi (28.13 Kg/cm).

In another embodiment, the circuit board, comprising in the following order:

a. a first polyimide coverlay derived from 100 mole % 3,3',4,4'-biphenyl tetracarboxylic dianhydride, 20 to 30 mole % 2,2'-bis(trifluoromethyl) benzidine, and 70 to 80 mole % 4,4'-oxydianiline;

b. a first imaged metal layer c. a first electrically insulating layer having a first side and a second side; the first side of the first electrically insulating layer is next to the first imaged metal layer and is derived from 100 mole % 3,3',4,4'-biphenyl tetracarboxylic dianhydride, 20 to 30 mole % 2,2'-bis(trifluoromethyl) benzidine, and 70 to 80 mole % 4,4'-oxydianiline;

d. a second imaged metal layer; the second side of the first electrically insulating layer is next to the second imaged metal layer;

e. a polyimide bondply derived from 100 mole % 3,3',4,4'-biphenyl tetracarboxylic dianhydride, 20 to 30 mole % 2,2'-bis(trifluoromethyl) benzidine, and 70 to 80 mole % 4,4'-oxydianiline;

f. a third imaged metal layer;

g. a second electrically insulating layer having a first side and a second side; the first side of the second electrically insulating layer is next to the third imaged metal layer and is derived from 100 mole % 3,3',4,4'-biphenyl tetracarboxylic dianhydride, 20 to 30 mole % 2,2'-bis(trifluoromethyl) benzidine, and 70 to 80 mole % 4,4'-oxydianiline h. a fourth imaged metal layer; the second side of the second electrically insulating layer is next to the fourth imaged metal layer;

i. a second polyimide coverlay derived from 100 mole % 3,3',4,4'-biphenyl tetracarboxylic dianhydride, 20 to 30 mole % 2,2'-bis(trifluoromethyl) benzidine, and 70 to 80 mole % 4,4'-oxydianiline. The polyimide bondply is in direct contact with the second imaged metal layer and exposed areas of the second side of the first electrically insulating layer and in direct contact with the third imaged metal layer and exposed areas of the first side of the second electrically insulating layer. The polyimide bondply has a peel strength from 0.7 to 2 N/mm as measured in accordance with IPC-TM-650-2.4.9d, when
   i) the first imaged metal layer, the first electrically insulating layer and the second image metal layer;
   ii) the polyimide bondply;
   iii) the third imaged metal layer, the second electrically insulating layer and the fourth imaged metal layer are laminated at a lamination temperature from 300 to 380° C. and a pressure from 150 psi (10.55 Kg/cm) to 400 psi (28.13 Kg/cm).

In some embodiments it is desirable to have a coverlay with a matte appearance. Polymeric materials typically have inherent surface gloss. To control gloss (and thereby produce matte surface characteristics) various additive approaches are possible to achieve dull and low gloss surface characteristics.

Silicas are inorganic particles that can be ground and filtered to specific particle size ranges. The very irregular shape and porosity of silica particles and low cost make it a popular matting agent. Other potential matting agents can include: i. other ceramics, such as, borides, nitrides, carbides and other oxides (e.g., alumina, titania, etc); and ii. organic particles. In some embodiments, the organic particles must withstand the high temperature processing of a chemically converted polyimide (processing temperatures of from about 250° C. to about 550° C., depending upon the particular polyimide process chosen) when the coverlay is a polyimide coverlay. One organic matting agent that can withstand the thermal conditions of polyimide synthesis are polyimide particles. In some embodiments, the matting agent is polyimide particles. In some embodiments, the first polyimide coverlay comprises polyimide particles. In some embodiments, the second polyimide coverlay comprises polyimide particles. In some embodiments, both the first polyimide coverlay and the second polyimide coverlay comprise polyimide particles.

The amount of matting agent, median particle size and density must be sufficient to produce the desired 60 degree gloss value. In some embodiments, the 60 degree gloss value is between and optionally including any two of the following: 2, 5, 10, 15, 20, 25, 30 and 35. In some embodiments, the 60 degree gloss value is from 10 to 35. In some embodiments, the 60 degree gloss value is from 2 to 25. The 60 degree gloss value is measured using Micro-TRI Gloss gloss meter.

In some embodiments, the first polyimide coverlay and the second polyimide coverlay independently comprise, a matting agent present in an amount between and optionally including any two of the following: 1.6, 2, 3, 4, 5, 6, 7, 8, 9 and 10 weight percent of polyimide coverlay. In some embodiments, the matting agent has a median particle size between and optionally including any two of the following: 1.3, 2, 3, 4, 5, 6, 7, 8, 9 and 10 microns. The matting agent particles should have an average particle size of less than (or equal to) about 10 microns and greater than (or equal to) about 1.3 microns. Larger matting agent particles may negatively impact mechanical properties. In some embodiments, the matting agent has a density between and optionally including any two of the following: 2, 3, 4 and 4.5 g/cc. In some embodiments, the matting agent is selected from the group consisting of silica, alumina, barium sulfate and mixtures thereof.

In some embodiments, the first polyimide coverlay comprises a pigment and a matting agent. In some embodiments, the second polyimide coverlay comprises a pigment and a matting agent. In some embodiments the first polyimide coverlay, the second polyimide coverlay or both comprise a pigment and a matting agent.

In some embodiments, the pigment and the matting agent are both a low conductivity carbon black and in such embodiments, the low conductivity carbon black is present in the first polyimide coverlay in an amount from 2 to 20 weight percent.

In some embodiments, the pigment and the matting agent are both a low conductivity carbon black and in such embodiments, the low conductivity carbon black is present in the first polyimide coverlay in an amount between and including any two of the following: 2, 5, 10, 15 and 20 weight percent.

In some embodiments, the pigment and the matting agent are both a low conductivity carbon black and in such embodiments, the low conductivity carbon black is present in the second polyimide coverlay in an amount between and including any two of the following: 2, 5, 10, 15 and 20 weight percent.

In some embodiments, the pigment and the matting agent in both the first polyimide coverlay and the second polyimide coverlay are a low conductivity carbon black and the low conductivity carbon black is present in the first polyimide coverlay in an amount from 2 to 20 weight percent and the low conductivity carbon black is present in the second polyimide coverlay in an amount from 2 to 20 weight percent.

In some embodiments, the pigment and the matting agent are both a low conductivity carbon black and the low conductivity carbon black is present in the first polyimide coverlay, the second polyimide coverlay or both in an amount from 2 to 20 weight percent.

In another embodiment, the matting agent is polyimide particles.

In another embodiment, the first polyimide coverlay, the second polyimide coverlay or both comprise a low conductivity carbon black and a matting agent.

In some embodiments, the pigment and the matting agent are both a low conductivity carbon black and in such embodiments, the low conductivity carbon black is present in the first polyimide coverlay in an amount between and including any two of the following: 2, 5, 10, 15 and 20 weight percent.

In some embodiments, the first polyimide coverlay comprises a low conductivity carbon black present in an amount from 2 to 9 weight percent and the second polyimide coverlay comprises a non-carbon black pigment present in an amount from 10 to 60 weight percent.

In another embodiment, the first polyimide coverlay comprises a low conductivity carbon black present in an amount from 2 to 9 weight percent and the second polyimide coverlay comprises a pigment and a matting agent. In another embodiment, the pigment and the matting agent in the second polyimide coverlay are both a low conductivity carbon black, the carbon black present in an amount from 2 to 20 weight percent.

In another embodiment, the first polyimide coverlay comprises a low conductivity carbon black present in an amount from 2 to 9 weight percent and the second polyimide coverlay comprises a pigment and a matting agent, and wherein the matting agent is polyimide particles.

In another embodiment, the circuit board, comprises in the following order:

a. a first polyimide coverlay derived from 100 mole % 3,3',4,4'-biphenyl tetracarboxylic dianhydride, 40 to 90 mole % 2,2'-bis(trifluoromethyl) benzidine, and 10 to 60 mole % 4,4'-oxydianiline;

b. a first imaged metal layer c. a first electrically insulating layer having a first side and a second side; the first side of the first electrically insulating layer is next to the first imaged metal layer d. a second imaged metal layer; the second side of the first electrically insulating layer is next to the second imaged metal layer;

e. a polyimide bondply derived from 100 mole % 3,3',4,4'-biphenyl tetracarboxylic dianhydride, 40 to 90 mole % 2,2'-bis(trifluoromethyl) benzidine, and 10 to 60 mole % 4,4'-oxydianiline;

f. a third imaged metal layer;

g. a second electrically insulating layer having a first side and a second side; the first side of the second electrically insulating layer is next to the third imaged metal layer h. a fourth imaged metal layer, the second side of the second electrically insulating layer is next to the fourth imaged metal layer;

i. a second polyimide coverlay derived from 100 mole % 3,3',4,4'-biphenyl tetracarboxylic dianhydride, 40 to 90 mole % 2,2'-bis(trifluoromethyl) benzidine, and 10 to 60 mole % 4,4'-oxydianiline. The polyimide bondply is in direct contact with the second imaged metal layer and exposed areas of the second side of the first electrically insulating layer; and in direct contact with the third imaged metal layer and exposed areas of the first side of the second electrically insulating layer. The polyimide bondply has a peel strength from 1 to 2 N/mm as measured in accordance with IPC-TM-650-2.4.9d, when i) the first imaged metal layer, the first electrically insulating layer and the second image metal layer;

ii) the polyimide bondply;

iii) the third imaged metal layer, the second electrically insulating layer and the fourth imaged metal layer are laminated at a lamination temperature from 320 to 3800 and a pressure from 150 psi (10.55 Kg/cm) to 400 psi (28.13 Kg/cm). The first polyimide coverlay is in direct contact with the first imaged metal layer and exposed areas of the first side of the first electrically insulating layer and wherein the second polyimide coverlay is in direct contact with the fourth imaged metal layer and exposed areas of the second side of the second electrically insulating layer and the first electrically insulating layer and the second electrically insulating layer are any electrically insulating material that can withstand the lamination temperature from 320 to 380° C. The first polyimide coverlay, the second polyimide coverlay or both comprise a pigment and a matting agent.

In yet another embodiment, the circuit board, comprises in the following order:

a. a first polyimide coverlay derived from 100 mole % 3,3',4,4'-biphenyl tetracarboxylic dianhydride, 40 to 90 mole % 2,2'-bis(trifluoromethyl) benzidine, and 10 to 60 mole % 4,4'-oxydianiline;

b. a first imaged metal layer c. a first electrically insulating layer having a first side and a second side; the first side of the first electrically insulating layer is next to the first imaged metal layer d. a second imaged metal layer, the second side of the first electrically insulating layer is next to the second imaged metal layer;

e. a polyimide bondply derived from 100 mole % 3,3',4,4'-biphenyl tetracarboxylic dianhydride, 40 to 90 mole % 2,2'-bis(trifluoromethyl) benzidine, and 10 to 60 mole % 4,4'-oxydianiline;

f. a third imaged metal layer;

g. a second electrically insulating layer having a first side and a second side; the first side of the second electrically insulating layer is next to the third imaged metal layer h. a fourth imaged metal layer; the second side of the second electrically insulating layer is next to the fourth imaged metal layer;

i. a second polyimide coverlay derived from 100 mole % 3,3',4,4'-biphenyl tetracarboxylic dianhydride, 40 to 90 mole % 2,2'-bis(trifluoromethyl) benzidine, and 10 to 60 mole % 4,4'-oxydianiline. The polyimide bondply is in direct contact with the second imaged metal layer and exposed areas of the second side of the first electrically insulating layer; and in direct contact with the third imaged metal layer and exposed areas of the first side of the second electrically insulating layer. The polyimide bondply has a peel strength from 1 to 2 N/mm as measured in accordance with IPC-TM-650-2.4.9d, when i) the first imaged metal layer, the first electrically insulating layer and the second image metal layer;

ii) the polyimide bondply;

iii) the third imaged metal layer, the second electrically insulating layer and the fourth imaged metal layer are laminated at a lamination temperature from 320 to 380° C. and a pressure from 150 psi (10.55 Kg/cm) to 400 psi (28.13 Kg/cm). The first polyimide coverlay is in direct contact with the first imaged metal layer and exposed areas of the first side of the first electrically insulating layer and wherein the second polyimide coverlay is in direct contact with the fourth imaged metal layer and exposed areas of the second side of the second electrically insulating layer and the first electrically insulating layer and the second electrically insulating layer are any electrically insulating material that can withstand the lamination temperature from 320 to 380° C. The first polyimide coverlay, the second polyimide coverlay or both comprise a low conductivity carbon black and a matting agent.

In yet another embodiment, the circuit board, comprises in the following order:

a. a first polyimide coverlay derived from 100 mole % 3,3',4,4'-biphenyl tetracarboxylic dianhydride, 40 to 90 mole % 2,2'-bis(trifluoromethyl) benzidine, and 10 to 60 mole % 4,4'-oxydianiline;

b. a first imaged metal layer c. a first electrically insulating layer having a first side and a second side; the first side of the first electrically insulating layer is next to the first imaged metal layer d. a second imaged metal layer; the second side of the first electrically insulating layer is next to the second imaged metal layer;

e. a polyimide bondply derived from 100 mole % 3,3',4,4'-biphenyl tetracarboxylic dianhydride, 40 to 90 mole % 2,2'-bis(trifluoromethyl) benzidine, and 10 to 60 mole % 4,4'-oxydianiline;

f. a third imaged metal layer;

g. a second electrically insulating layer having a first side and a second side; the first side of the second electrically insulating layer is next to the third imaged metal layer h. a fourth imaged metal layer; the second side of the second electrically insulating layer is next to the fourth imaged metal layer;

i. a second polyimide coverlay derived from 100 mole % 3,3',4,4'-biphenyl tetracarboxylic dianhydride, 40 to 90 mole % 2,2'-bis(trifluoromethyl) benzidine, and 10 to 60 mole % 4,4'-oxydianiline. The polyimide bondply is in direct contact with the second imaged metal layer and exposed areas of the second side of the first electrically insulating layer; and in direct contact with the third imaged metal layer and exposed areas of the first side of the second electrically insulating layer. The polyimide bondply has a peel strength from 1 to 2 N/mm as measured in accordance with IPC-TM-650-2.4.9d, when i) the first imaged metal layer, the first electrically insulating layer and the second image metal layer;

ii) the polyimide bondply;

iii) the third imaged metal layer, the second electrically insulating layer and the fourth imaged metal layer are laminated at a lamination temperature from 320 to 380° C. and a pressure from 150 psi (10.55 Kg/cm) to 400 psi (28.13 Kg/cm). The first polyimide coverlay is in direct contact with the first imaged metal layer and exposed areas of the first side of the first electrically insulating layer and wherein the second polyimide coverlay is in direct contact with the fourth imaged metal layer and exposed areas of the second side of the second electrically insulating layer and the first electrically insulating layer and the second electrically insulating layer are any electrically insulating material that can withstand the lamination temperature from 320 to 380° C. And wherein the first polyimide coverlay, the second polyimide coverlay or both comprise a pigment and a matting agent and wherein the pigment and the matting agent are both a low conductivity carbon black and the low conductivity carbon black is present in the first polyimide coverlay, the second polyimide coverlay or both in an amount from 2 to 20 weight percent.

In another embodiment, the circuit board, comprises in the following order:

a. a first polyimide coverlay derived from 100 mole % 3,3',4,4'-biphenyl tetracarboxylic dianhydride, 40 to 90 mole % 2,2'-bis(trifluoromethyl) benzidine, and 10 to 60 mole % 4,4'-oxydianiline;

b. a first imaged metal layer c. a first electrically insulating layer having a first side and a second side; the first side of the first electrically insulating layer is next to the first imaged metal layer d. a second imaged metal layer, the second side of the first electrically insulating layer is next to the second imaged metal layer;

e. a polyimide bondply derived from 100 mole % 3,3',4,4'-biphenyl tetracarboxylic dianhydride, 40 to 90 mole % 2,2'-bis(trifluoromethyl) benzidine, and 10 to 60 mole % 4,4'-oxydianiline;

f. a third imaged metal layer;

g. a second electrically insulating layer having a first side and a second side; the first side of the second electrically insulating layer is next to the third imaged metal layer h. a fourth imaged metal layer, the second side of the second electrically insulating layer is next to the fourth imaged metal layer;

i. a second polyimide coverlay derived from 100 mole % 3,3',4,4'-biphenyl tetracarboxylic dianhydride, 40 to 90 mole % 2,2'-bis(trifluoromethyl) benzidine, and 10 to 60 mole % 4,4'-oxydianiline. The polyimide bondply is in direct contact with the second imaged metal layer and exposed areas of the second side of the first electrically insulating layer; and in direct contact with the third imaged metal layer and exposed areas of the first side of the second electrically insulating layer. The polyimide bondply has a peel strength from 1 to 2 N/mm as measured in accordance with IPC-TM-650-2.4.9d, when i) the first imaged metal layer, the first electrically insulating layer and the second image metal layer;

ii) the polyimide bondply;

iii) the third imaged metal layer, the second electrically insulating layer and the fourth imaged metal layer are laminated at a lamination temperature from 320 to 380° C. and a pressure from 150 psi (10.55 Kg/cm) to 400 psi (28.13 Kg/cm). The first polyimide coverlay is in direct contact with the first imaged metal layer and exposed areas of the first side of the first electrically insulating layer and wherein the second polyimide coverlay is in direct contact with the fourth imaged metal layer and exposed areas of the second side of the second electrically insulating layer and the first electrically insulating layer and the second electrically insulating layer are any electrically insulating material that can withstand the lamination temperature from 320 to 380° C. And wherein the first polyimide coverlay, the second polyimide coverlay or both comprise a pigment and a matting agent and wherein the matting agent is polyimide particles.

In another embodiment, the circuit board, comprising in the following order:

a. a first polyimide coverlay derived from 100 mole % 3,3',4,4'-biphenyl tetracarboxylic dianhydride, 40 to 90 mole % 2,2'-bis(trifluoromethyl) benzidine, and 10 to 60 mole % 4,4'-oxydianiline;

b. a first imaged metal layer c. a first electrically insulating layer having a first side and a second side; the first side of the first electrically insulating layer is next to the first imaged metal layer and is derived from 100 mole % 3,3',4,4'-biphenyl tetracarboxylic dianhydride, 40 to 90 mole % 2,2'-bis(trifluoromethyl) benzidine, and 10 to 60 mole % 4,4'-oxydianiline;

d. a second imaged metal layer; the second side of the first electrically insulating layer is next to the second imaged metal layer;

e. a polyimide bondply derived from 100 mole % 3,3',4,4'-biphenyl tetracarboxylic dianhydride, 40 to 90 mole % 2,2'-bis(trifluoromethyl) benzidine, and 10 to 60 mole % 4,4'-oxydianiline;

f. a third imaged metal layer;

g. a second electrically insulating layer having a first side and a second side; the first side of the second electrically insulating layer is next to the third imaged metal layer and is derived from 100 mole % 3,3',4,4'-biphenyl tetracarboxylic dianhydride, 40 to 90 mole % 2,2'-bis(trifluoromethyl) benzidine, and 10 to 60 mole % 4,4'-oxydianiline h. a fourth imaged metal layer, the second side of the second electrically insulating layer is next to the fourth imaged metal layer;

i. a second polyimide coverlay derived from 100 mole % 3,3',4,4'-biphenyl tetracarboxylic dianhydride, 40 to 90 mole % 2,2'-bis(trifluoromethyl) benzidine, and 10 to 60 mole % 4,4'-oxydianiline. The polyimide bondply is in direct contact with the second imaged metal layer and exposed areas of the second side of the first electrically insulating layer; and in direct contact with the third imaged metal layer and exposed areas of the first side of the second electrically insulating layer. The polyimide bondply has a peel strength from 1 to 2 N/mm as measured in accordance with IPC-TM-650-2.4.9d, when i) the first imaged metal layer, the first electrically insulating layer and the second image metal layer;

ii) the polyimide bondply;

iii) the third imaged metal layer, the second electrically insulating layer and the fourth imaged metal layer are laminated at a lamination temperature from 320 to 380° C. and a pressure from 150 psi (10.55 Kg/cm) to 400 psi (28.13 Kg/cm). The first polyimide coverlay is in direct contact with the first imaged metal layer and exposed areas of the first side of the first electrically insulating layer and wherein the second polyimide coverlay is in direct contact with the fourth imaged metal layer and exposed areas of the second side of the second electrically insulating layer. The first polyimide coverlay, the second polyimide coverlay or both comprise a pigment and a matting agent.

In another embodiment, the circuit board, comprising in the following order:

a. a first polyimide coverlay derived from 100 mole % 3,3',4,4'-biphenyl tetracarboxylic dianhydride, 40 to 90 mole % 2,2'-bis(trifluoromethyl) benzidine, and 10 to 60 mole % 4,4'-oxydianiline;

b. a first imaged metal layer c. a first electrically insulating layer having a first side and a second side; the first side of the first electrically insulating layer is next to the first imaged metal layer and is derived from 100 mole % 3,3',4,4'-biphenyl tetracarboxylic dianhydride, 40 to 90 mole % 2,2'-bis(trifluoromethyl) benzidine, and 10 to 60 mole % 4,4'-oxydianiline;

d. a second imaged metal layer; the second side of the first electrically insulating layer is next to the second imaged metal layer, e. a polyimide bondply derived from 100 mole % 3,3',4, 4'-biphenyl tetracarboxylic dianhydride, 40 to 90 mole % 2,2'-bis(trifluoromethyl) benzidine, and 10 to 60 mole % 4,4'-oxydianiline;

f. a third imaged metal layer;

g. a second electrically insulating layer having a first side and a second side; the first side of the second electrically insulating layer is next to the third imaged metal layer and is derived from 100 mole % 3,3',4,4'-biphenyl tetracarboxylic dianhydride, 40 to 90 mole % 2,2'-bis(trifluoromethyl) benzidine, and 10 to 60 mole % 4,4'-oxydianiline h. a fourth imaged metal layer; the second side of the second electrically insulating layer is next to the fourth imaged metal layer;

i. a second polyimide coverlay derived from 100 mole % 3,3',4,4'-biphenyl tetracarboxylic dianhydride, 40 to 90 mole % 2,2'-bis(trifluoromethyl) benzidine, and 10 to 60 mole % 4,4'-oxydianiline. The polyimide bondply is in direct contact with the second imaged metal layer and exposed areas of the second side of the first electrically insulating layer; and in direct contact with the third imaged metal layer and exposed areas of the first side of the second electrically insulating layer. The polyimide bondply has a peel strength from 1 to 2 N/mm as measured in accordance with IPC-TM-650-2.4.9d, when i) the first imaged metal layer, the first electrically insulating layer and the second image metal layer;

ii) the polyimide bondply;

iii) the third imaged metal layer, the second electrically insulating layer and the fourth imaged metal layer are laminated at a lamination temperature from 320 to 380° C. and a pressure from 150 psi (10.55 Kg/cm) to 400 psi (28.13 Kg/cm). The first polyimide coverlay is in direct contact with the first imaged metal layer and exposed areas of the first side of the first electrically insulating layer and wherein the second polyimide coverlay is in direct contact with the fourth imaged metal layer and exposed areas of the second side of the second electrically insulating layer. The first polyimide coverlay, the second polyimide coverlay or both comprise a low conductivity carbon black and a matting agent.

In another embodiment, the circuit board, comprising in the following order:

a. a first polyimide coverlay derived from 100 mole % 3,3',4,4'-biphenyl tetracarboxylic dianhydride, 40 to 90 mole % 2,2'-bis(trifluoromethyl) benzidine, and 10 to 60 mole % 4,4'-oxydianiline;

b. a first imaged metal layer c. a first electrically insulating layer having a first side and a second side; the first side of the first electrically insulating layer is next to the first imaged metal layer and is derived from 100 mole % 3,3',4,4'-biphenyl tetracarboxylic dianhydride, 40 to 90 mole % 2,2'-bis(trifluoromethyl) benzidine, and 10 to 60 mole % 4,4'-oxydianiline;

d. a second imaged metal layer; the second side of the first electrically insulating layer is next to the second imaged metal layer e. a polyimide bondply derived from 100 mole % 3,3',4, 4'-biphenyl tetracarboxylic dianhydride, 40 to 90 mole % 2,2'-bis(trifluoromethyl) benzidine, and 10 to 60 mole % 4,4'-oxydianiline;

f. a third imaged metal layer;

g. a second electrically insulating layer having a first side and a second side; the first side of the second electrically insulating layer is next to the third imaged metal layer and is derived from 100 mole % 3,3',4,4'-biphenyl tetracarboxylic dianhydride, 40 to 90 mole % 2,2'-bis(trifluoromethyl) benzidine, and 10 to 60 mole % 4,4'-oxydianiline h. a fourth imaged metal layer the second side of the second electrically insulating layer is next to the fourth imaged metal layer;

i. a second polyimide coverlay derived from 100 mole % 3,3',4,4'-biphenyl tetracarboxylic dianhydride, 40 to 90 mole % 2,2'-bis(trifluoromethyl) benzidine, and 10 to 60 mole % 4,4'-oxydianiline. The polyimide bondply is in direct contact with the second imaged metal layer and exposed areas of the second side of the first electrically insulating layer; and in direct contact with the third imaged metal layer and exposed areas of the first side of the second electrically insulating layer. The polyimide bondply has a peel strength from 1 to 2 N/mm as measured in accordance with IPC-TM-650-2.4.9d, when i) the first imaged metal layer, the first electrically insulating layer and the second image metal layer ii) the polyimide bondply;

iii) the third imaged metal layer, the second electrically insulating layer and the fourth imaged metal layer are laminated at a lamination temperature from 320 to 380° C. and a pressure from 150 psi (10.55 Kg/cm) to 400 psi (28.13 Kg/cm). The first polyimide coverlay is in direct contact with the first imaged metal layer and exposed areas of the first side of the first electrically insulating layer and wherein the second polyimide coverlay is in direct contact with the fourth imaged metal layer and exposed areas of the second side of the second electrically insulating layer. And wherein the first polyimide coverlay, the second polyimide coverlay or both comprise a pigment and a matting agent and wherein the pigment and the matting agent are both a low conductivity carbon black and the low conductivity carbon black is present in the first polyimide coverlay, the second polyimide coverlay or both in an amount from 2 to 20 weight percent.

In another embodiment, the circuit board, comprising in the following order:

a. a first polyimide coverlay derived from 100 mole % 3,3',4,4'-biphenyl tetracarboxylic dianhydride, 40 to 90 mole % 2,2'-bis(trifluoromethyl) benzidine, and 10 to 60 mole % 4,4'-oxydianiline;

b. a first imaged metal layer c. a first electrically insulating layer having a first side and a second side; the first side of the first electrically insulating layer is next to the first imaged metal layer and is derived from 100 mole % 3,3',4,4'-biphenyl tetracarboxylic dianhydride, 40 to 90 mole % 2,2'-bis(trifluoromethyl) benzidine, and 10 to 60 mole % 4,4'-oxydianiline;

d. a second imaged metal layer; the second side of the first electrically insulating layer is next to the second imaged metal layer;

e. a polyimide bondply derived from 100 mole % 3,3',4,4'-biphenyl tetracarboxylic dianhydride, 40 to 90 mole % 2,2'-bis(trifluoromethyl) benzidine, and 10 to 60 mole % 4,4'-oxydianiline;

f. a third imaged metal layer;

g. a second electrically insulating layer having a first side and a second side; the first side of the second electrically insulating layer is next to the third imaged metal layer and is derived from 100 mole % 3,3',4,4'-biphenyl tetracarboxylic dianhydride, 40 to 90 mole % 2,2'-bis(trifluoromethyl) benzidine, and 10 to 60 mole % 4,4'-oxydianiline h. a fourth imaged metal layer; the second side of the second electrically insulating layer is next to the fourth imaged metal layer;

i. a second polyimide coverlay derived from 100 mole % 3,3',4,4'-biphenyl tetracarboxylic dianhydride, 40 to 90 mole % 2,2'-bis(trifluoromethyl) benzidine, and 10 to 60 mole % 4,4'-oxydianiline. The polyimide bondply is in direct contact with the second imaged metal layer and exposed areas of the second side of the first electrically insulating layer and in direct contact with the third imaged metal layer and exposed areas of the first side of the second electrically insulating layer. The polyimide bondply has a peel strength from 1 to 2 N/mm as measured in accordance with IPC-TM-650-2.4.9d, when i) the first imaged metal layer, the first electrically insulating layer and the second image metal layer;

ii) the polyimide bondply;

iii) the third imaged metal layer, the second electrically insulating layer and the fourth imaged metal layer are laminated at a lamination temperature from 320 to 380° C. and a pressure from 150 psi (10.55 Kg/cm) to 400 psi (28.13 Kg/cm). The first polyimide coverlay is in direct contact with the first imaged metal layer and exposed areas of the first side of the first electrically insulating layer and wherein the second polyimide coverlay is in direct contact with the fourth imaged metal layer and exposed areas of the second side of the second electrically insulating layer. And wherein the first polyimide coverlay, the second polyimide coverlay or both comprise a pigment and a matting agent and wherein the matting agent is polyimide particles.

In yet another embodiment, the circuit board, comprising in the following order a. a first polyimide coverlay derived from 100 mole % 3,3',4,4'-biphenyl tetracarboxylic dianhydride, 40 to 90 mole % 2,2'-bis(trifluoromethyl) benzidine, and 10 to 60 mole % 4,4'-oxydianiline;

b. a first imaged copper layer c. a first electrically insulating layer having a first side and a second side; the first side of the first electrically insulating layer is next to the first imaged copper layer d. a second imaged copper layer; the second side of the first electrically insulating layer is next to the second imaged copper layer e. a polyimide bondply derived from 100 mole % 3,3',4,4'-biphenyl tetracarboxylic dianhydride, 40 to 90 mole % 2,2'-bis(trifluoromethyl) benzidine, and 10 to 60 mole % 4,4'-oxydianiline;

f. a third imaged copper layer;

g. a second electrically insulating layer having a first side and a second side; the first side of the second electrically insulating layer is next to the third imaged copper layer h. a fourth imaged copper layer; the second side of the second electrically insulating layer is next to the fourth imaged copper layer;

i. a second polyimide coverlay derived from 100 mole % 3,3',4,4'-biphenyl tetracarboxylic dianhydride, 40 to 90 mole % 2,2'-bis(trifluoromethyl) benzidine, and 10 to 60 mole % 4,4'-oxydianiline. The polyimide bondply is in direct contact with the second imaged copper layer and exposed areas of the second side of the first electrically insulating layer; and in direct contact with the third imaged copper layer and exposed areas of the first side of the second electrically insulating layer. The polyimide bondply has a peel strength from 1 to 2 N/mm as measured in accordance with IPC-TM-650-2.4.9d, when i) the first imaged copper layer, the first electrically insulating layer and the second imaged copper layer;

ii) the polyimide bondply;

iii) the third imaged copper layer, the second electrically insulating layer and the fourth imaged copper layer are laminated at a lamination temperature from 320 to 380° C. and a pressure from 150 psi (10.55 Kg/cm) to 400 psi (28.13 Kg/cm). The first polyimide coverlay is in direct contact with the first imaged copper layer and exposed areas of the first side of the first electrically insulating layer and wherein the second polyimide coverlay is in direct contact with the fourth imaged copper layer and exposed areas of the second side of the second electrically insulating layer and wherein the first polyimide coverlay, the second polyimide coverlay or both comprise a pigment and a matting agent.

In yet another embodiment, the circuit board, comprising in the following order a. a first polyimide coverlay derived from 100 mole % 3,3',4,4'-biphenyl tetracarboxylic dianhydride, 40 to 90 mole % 2,2'-bis(trifluoromethyl) benzidine, and 10 to 60 mole % 4,4'-oxydianiline;

b. a first imaged copper layer c. a first electrically insulating layer having a first side and a second side; the first side of the first electrically insulating layer is next to the first imaged copper layer and is derived from 100 mole % 3,3',4,4'-biphenyl tetracarboxylic dianhydride, 40 to 90 mole % 2,2'-bis(trifluoromethyl) benzidine, and 10 to 60 mole % 4,4'-oxydianiline;

d. a second imaged copper layer; the second side of the first electrically insulating layer is next to the second imaged copper layer e. a polyimide bondply derived from 100 mole % 3,3',4,4'-biphenyl tetracarboxylic dianhydride, 40 to 90 mole % 2,2'-bis(trifluoromethyl) benzidine, and 10 to 60 mole % 4,4'-oxydianiline;

f. a third imaged copper layer;

g. a second electrically insulating layer having a first side and a second side; the first side of the second electrically insulating layer is next to the third imaged copper layer and is derived from 100 mole % 3,3',4,4'-biphenyl tetracarboxylic dianhydride, 40 to 90 mole % 2,2'-bis(trifluoromethyl) benzidine, and 10 to 60 mole % 4,4'-oxydianiline h. a fourth imaged copper layer; the second side of the second electrically insulating layer is next to the fourth imaged copper layer;

i. a second polyimide coverlay derived from 100 mole % 3,3',4,4'-biphenyl tetracarboxylic dianhydride, 40 to 90 mole % 2,2'-bis(trifluoromethyl) benzidine, and 10 to 60 mole % 4,4'-oxydianiline. The polyimide bondply is in direct contact with the second imaged copper layer and exposed areas of the second side of the first electrically insulating layer and in direct contact with the third imaged copper layer and exposed areas of the first side of the second electrically insulating layer. The polyimide bondply has a peel strength from 1 to 2 N/mm as measured in accordance with IPC-TM-650-2.4.9d, when i) the first imaged copper layer, the first electrically insulating layer and the second imaged copper layer;

ii) the polyimide bondply:

iii) the third imaged copper layer, the second electrically insulating layer and the fourth imaged copper layer are laminated at a lamination temperature from 320 to 380° C. and a pressure from 150 psi (10.55 Kg/cm) to 400 psi (28.13 Kg/cm). The first polyimide coverlay is in direct contact with the first imaged copper layer and exposed areas of the first side of the first electrically insulating layer and wherein the second polyimide coverlay is in direct contact with the fourth imaged copper layer and exposed areas of the second side of the second electrically insulating layer and wherein the first polyimide coverlay, the second polyimide coverlay or both comprise a pigment and a matting agent.

In yet another embodiment, the circuit board, comprising in the following order:

a. a first polyimide coverlay derived from 100 mole % 3,3',4,4'-biphenyl tetracarboxylic dianhydride, 40 to 90 mole % 2,2'-bis(trifluoromethyl) benzidine, and 10 to 60 mole % 4,4'-oxydianiline;

b. a first imaged copper layer c. a first electrically insulating layer having a first side and a second side; the first side of the first electrically insulating layer is next to the first imaged copper layer and is derived from 100 mole % 3,3',4,4'-biphenyl tetracarboxylic dianhydride, 40 to 90 mole % 2,2'-bis(trifluoromethyl) benzidine, and 10 to 60 mole % 4,4'-oxydianiline;

d. a second imaged copper layer; the second side of the first electrically insulating layer is next to the second imaged copper layer;

e. a polyimide bondply derived from 100 mole % 3,3',4,4'-biphenyl tetracarboxylic dianhydride, 40 to 90 mole % 2,2'-bis(trifluoromethyl) benzidine, and 10 to 60 mole % 4,4'-oxydianiline;

f. a third imaged copper layer;

g. a second electrically insulating layer having a first side and a second side; the first side of the second electrically insulating layer is next to the third imaged copper layer and is derived from 100 mole % 3,3',4,4'-biphenyl tetracarboxylic dianhydride, 40 to 90 mole % 2,2'-bis(trifluoromethyl) benzidine, and 10 to 60 mole % 4,4'-oxydianiline h. a fourth imaged copper layer; the second side of the second electrically insulating layer is next to the fourth imaged copper layer i. a second polyimide coverlay derived from 100 mole % 3,3',4,4'-biphenyl tetracarboxylic dianhydride, 40 to 90 mole % 2,2'-bis(trifluoromethyl) benzidine, and 10 to 60 mole % 4,4'-oxydianiline. The polyimide bondply is in direct contact with the second imaged copper layer and exposed areas of the second side of the first electrically insulating layer; and in direct contact with the third imaged copper layer and exposed areas of the first side of the second electrically insulating layer. The polyimide bondply has a peel strength from 1 to 2 N/mm as measured in accordance with IPC-TM-650-2.4.9d, when i) the first imaged copper layer, the first electrically insulating layer and the second imaged copper layer;

ii) the polyimide bondply;

iii) the third imaged copper layer, the second electrically insulating layer and the fourth imaged copper layer are laminated at a lamination temperature from 320 to 380° C. and a pressure from 150 psi (10.55 Kg/cm) to 400 psi (28.13 h. a fourth imaged copper layer; the second side of the second electrically insulating layer is next to the fourth imaged copper layer;

i. a second polyimide coverlay derived from 100 mole % 3,3',4,4'-biphenyl tetracarboxylic dianhydride, 40 to 90 mole % 2,2'-bis(trifluoromethyl) benzidine, and 10 to 60 mole % 4,4'-oxydianiline. The polyimide bondply is in direct contact with the second imaged copper layer and exposed areas of the second side of the first electrically insulating layer and in direct contact with the third imaged copper layer and exposed areas of the first side of the second electrically insulating layer. The polyimide bondply has a peel strength from 1 to 2 N/mm as measured in accordance with IPC-TM-650-2.4.9d, when i) the first imaged copper layer, the first electrically insulating layer and the second imaged copper layer;

ii) the polyimide bondply:

iii) the third imaged copper layer, the second electrically insulating layer and the fourth imaged copper layer are laminated at a lamination temperature from 320 to 380° C. and a pressure from 150 psi (10.55 Kg/cm) to 400 psi (28.13 Kg/cm). The first polyimide coverlay is in direct contact with the first imaged copper layer and exposed areas of the first side of the first electrically insulating layer and wherein the second polyimide coverlay is in direct contact with the fourth imaged copper layer and exposed areas of the second side of the second electrically insulating layer and wherein the first polyimide coverlay, the second polyimide coverlay or both comprise a pigment and a matting agent and wherein the matting agent is polyimide particles.

In yet another embodiment, the circuit board, comprising in the following order a. a first polyimide coverlay derived from 100 mole % 3,3',4,4'-biphenyl tetracarboxylic dianhydride, 40 to 90 mole % 2,2'-bis(trifluoromethyl) benzidine, and 10 to 60 mole % 4,4'-oxydianiline;

b. a first imaged copper layer c. a first electrically insulating layer having a first side and a second side; the first side of the first electrically insulating layer is next to the first imaged copper layer and is derived from 100 mole % 3,3',4,4'-biphenyl tetracarboxylic dianhydride, 40 to 90 mole % 2,2'-bis(trifluoromethyl) benzidine, and 10 to 60 mole % 4,4'-oxydianiline;

d. a second imaged copper layer; the second side of the first electrically insulating layer is next to the second imaged copper layer, e. a polyimide bondply derived from 100 mole % 3,3',4,4'-biphenyl tetracarboxylic dianhydride, 40 to 90 mole % 2,2'-bis(trifluoromethyl) benzidine, and 10 to 60 mole % 4,4'-oxydianiline;

f. a third imaged copper layer;

g. a second electrically insulating layer having a first side and a second side; the first side of the second electrically insulating layer is next to the third imaged copper layer and is derived from 100 mole % 3,3',4,4'-biphenyl tetracarboxylic dianhydride, 40 to 90 mole % 2,2'-bis(trifluoromethyl) benzidine, and 10 to 60 mole % 4,4'-oxydianiline Kg/cm). The first polyimide coverlay is in direct contact with the first imaged copper layer and exposed areas of the first side of the first electrically insulating layer and wherein the second polyimide coverlay is in direct contact with the fourth imaged copper layer and exposed areas of the second side of the second electrically insulating layer and wherein the first polyimide coverlay, the second polyimide coverlay or both comprise a low conductivity carbon black and a matting agent.

In yet another embodiment, the circuit board, comprising in the following order
a. a first polyimide coverlay derived from 100 mole % 3,3',4,4'-biphenyl tetracarboxylic dianhydride, 40 to 90 mole % 2,2'-bis(trifluoromethyl) benzidine, and 10 to 60 mole % 4,4'-oxydianiline;
b. a first imaged copper layer
c. a first electrically insulating layer having a first side and a second side; the first side of the first electrically insulating layer is next to the first imaged copper layer and is derived from 100 mole % 3,3',4,4'-biphenyl tetracarboxylic dianhydride, 40 to 90 mole % 2,2'-bis(trifluoromethyl) benzidine, and 10 to 60 mole % 4,4'-oxydianiline;
d. a second imaged copper layer; the second side of the first electrically insulating layer is next to the second imaged copper layer;
e. a polyimide bondply derived from 100 mole % 3,3',4,4'-biphenyl tetracarboxylic dianhydride, 40 to 90 mole % 2,2'-bis(trifluoromethyl) benzidine, and 10 to 60 mole % 4,4'-oxydianiline;
f. a third imaged copper layer;
g. a second electrically insulating layer having a first side and a second side; the first side of the second electrically insulating layer is next to the third imaged copper layer and is derived from 100 mole % 3,3',4,4'-biphenyl tetracarboxylic dianhydride, 40 to 90 mole % 2,2'-bis(trifluoromethyl) benzidine, and 10 to 60 mole % 4,4'-oxydianiline
h. a fourth imaged copper layer; the second side of the second electrically insulating layer is next to the fourth imaged copper layer;
i. a second polyimide coverlay derived from 100 mole % 3,3',4,4'-biphenyl tetracarboxylic dianhydride, 40 to 90 mole % 2,2'-bis(trifluoromethyl) benzidine, and 10 to 60 mole % 4,4'-oxydianiline. The polyimide bondply is in direct contact with the second imaged copper layer and exposed areas of the second side of the first electrically insulating layer; and in direct contact with the third imaged copper layer and exposed areas of the first side of the second electrically insulating layer. The polyimide bondply has a peel strength from 1 to 2 N/mm as measured in accordance with IPC-TM-650-2.4.9d, when
i) the first imaged copper layer, the first electrically insulating layer and the second imaged copper layer;
ii) the polyimide bondply;
iii) the third imaged copper layer, the second electrically insulating layer and the fourth imaged copper layer are laminated at a lamination temperature from 320 to 380° C. and a pressure from 150 psi (10.55 Kg/cm) to 400 psi (28.13 Kg/cm). The first polyimide coverlay is in direct contact with the first imaged copper layer and exposed areas of the first side of the first electrically insulating layer and wherein the second polyimide coverlay is in direct contact with the fourth imaged copper layer and exposed areas of the second side of the second electrically insulating layer and wherein the first polyimide coverlay, the second polyimide coverlay or both comprise a pigment and a matting agent and wherein the pigment and the matting agent are both a low conductivity carbon black and the low conductivity carbon black is present in the first polyimide coverlay, the second polyimide coverlay or both in an amount from 2 to 20 weight percent.

A circuit board in accordance with any of the above embodiments wherein the first polyimide coverlay, the first electrically insulating layer, the polyimide bondply, the second electrically insulating layer and the second polyimide coverlay are derived from 100 mole % 3,3',4,4'-biphenyl tetracarboxylic dianhydride, 20 to 90 mole % 2,2'-bis(trifluoromethyl) benzidine, and 10 to 80 mole % 4,4'-oxydianiline.

A circuit board in accordance with any of the above embodiments wherein the first polyimide coverlay, the polyimide bondply and the second polyimide coverlay are derived from 100 mole % 3,3',4,4'-biphenyl tetracarboxylic dianhydride, 20 to 90 mole % 2,2'-bis(trifluoromethyl) benzidine, and 10 to 80 mole % 4,4'-oxydianiline.

In yet another embodiment, the circuit board, comprising in the following order
a. a first polyimide coverlay derived from 100 mole % 3,3',4,4'-biphenyl tetracarboxylic dianhydride, 20 to 90 mole % 2,2'-bis(trifluoromethyl) benzidine, and 10 to 80 mole % 4,4'-oxydianiline;
b. a first imaged copper layer
c. a first electrically insulating layer having a first side and a second side; the first side of the first electrically insulating layer is next to the first imaged copper layer and is derived from 100 mole % 3,3',4,4'-biphenyl tetracarboxylic dianhydride, 20 to 90 mole % 2,2'-bis(trifluoromethyl) benzidine, and 10 to 80 mole % 4,4'-oxydianiline;
d. a second imaged copper layer; the second side of the first electrically insulating layer is next to the second imaged copper layer;
e. a polyimide bondply derived from 100 mole % 3,3',4,4'-biphenyl tetracarboxylic dianhydride, 20 to 90 mole % 2,2'-bis(trifluoromethyl) benzidine, and 10 to 80 mole % 4,4'-oxydianiline;
f. a third imaged copper layer;
g. a second electrically insulating layer having a first side and a second side; the first side of the second electrically insulating layer is next to the third imaged copper layer and is derived from 100 mole % 3,3',4,4'-biphenyl tetracarboxylic dianhydride, 20 to 90 mole % 2,2'-bis(trifluoromethyl) benzidine, and 10 to 80 mole % 4,4'-oxydianiline
h. a fourth imaged copper layer; the second side of the second electrically insulating layer is next to the fourth imaged copper layer;
i. a second polyimide coverlay derived from 100 mole % 3,3',4,4'-biphenyl tetracarboxylic dianhydride, 20 to 90 mole % 2,2'-bis(trifluoromethyl) benzidine, and 10 to 80 mole % 4,4'-oxydianiline. The polyimide bondply is in direct contact with the second imaged copper layer and exposed areas of the second side of the first electrically insulating layer; and in direct contact with the third imaged copper layer and exposed areas of the first side of the second electrically insulating layer. The polyimide bondply has a peel strength from 0.7 to 2 N/mm as measured in accordance with IPC-TM-650-2.4.9d, when
i) the first imaged copper layer, the first electrically insulating layer and the second imaged copper layer;
ii) the polyimide bondply;
iii) the third imaged copper layer, the second electrically insulating layer and the fourth imaged copper layer are laminated at a lamination temperature from 300 to 380° C. and a pressure from 150 psi (10.55 Kg/cm) to 400 psi (28.13 Kg/cm). The first polyimide coverlay is in direct contact with the first imaged copper layer and exposed areas of the first side of the first electrically insulating layer and wherein the second polyimide coverlay is in direct contact with the fourth imaged copper layer and exposed areas of the second side of the second electrically insulating layer and wherein the first polyimide coverlay, the second polyimide coverlay or both comprise a pigment and a matting agent and wherein the matting agent is polyimide particles.

A circuit board in accordance with any of the above embodiments, wherein the first polyimide coverlay, the second polyimide coverlay or both comprise a low conductivity carbon black and a matting agent wherein the matting agent is polyimide particles.

In some embodiments, the circuit board is made by taking a first polyimide coverlay (if present), a double-sided clad (first imaged metal layer, first electrically insulating layer and a second imaged metal layer), bondply, a second double-sided clad (third imaged metal layer, second electrically insulating layer and a fourth imaged metal layer) and a second polyimide coverlay (if present) and laminating at lamination temperature of 320 to 380° C. and a pressure from 150 psi (10.55 Kg/cm) to 400 psi (28.13 Kg/cm) using a vacuum platen press.

EXAMPLES

The materials, methods, and examples herein are illustrative only and, except as specifically stated, are not intended to be limiting.

The glass transition temperatures of the polyimide films of the present invention were determined using a TA Instruments 2980 dynamic mechanical analyzer. The Tg measurement method used a sampling frequency of about 1.0 Hz (an amplitude of about 10.0 µm) and a pre-load force of about 0.01 N. A temperature ramp rate of about 5° C. min-1 was used.

The Tg was measured at the peak of the tan 8
Tensile Modulus was determined by ASTM D-882.
Tensile strength was determined by ASTM D-882
Elongation was determined by ASTM D-882
Dielectric Constant was measured as described in ASTM D150, "Standard Test Methods for AC Loss Characteristics and Permittivity (Dielectric Constant) of Solid Electrical Insulation". The composite film dielectric constant was calculated based on the measured capacitance of the 2.5 cm diameter capacitors.

In-plane CTE of a polyimide films of the present invention were measured using a TA Instruments TMA 2940 thermal mechanical analyzer. The expansion of a film was measured between about 50° C. and about 250° C. on a second pass. The expansion was then divided by the temperature difference (and sample length) to obtain the CTE in ppm ° C.-1. The first pass was used to remove shrinkage from the sample over the same temperature range as well as to dry out the sample. As such, the second pass then provided a CTE value characteristic of the film's inherent properties (e.g. minus water absorption and the effect water would have on a film's CTE). This method employed a 0.05 N load force and operated within the above mentioned temperature range ramping temperature at a rate of about 10° C. per minute Moisture absorption was determined by IPC-TM-650, Method 2.6.2.

Peel strength data reported in this application are the average of 8 to 12 measurements, consistent with requirement for statistically valid data per IPC-TM650 2.4.8d test method. The copper foil for the peel strength testing was 35 um thick roll annealed (RA) copper foil with pink treatment available from Somers Corporation.

Example 1

BPDA/TFMB

Example 1 shows that a polyimide derived from 100 mole % BPDA and 100 mole % TFMB has a peel strength of at least 1 N/mm when laminated at a temperature of 380° C. or greater.

Within a nitrogen inerted glovebox, 21.472 g (0.067 moles) of 2,2'-bis(trifluoromethyl) benzidine (TFMB) and 159 grams of N,N-dimethylacetamide (DMAc) were charged to a dried 250 milliliter jacketed beaker equipped with mechanical stirrer. The mixture was heated using recirculating 45° C. glycol-water for several minutes until the diamine had completely dissolved resulting in a near colorless solution. Next, 19.528 g (0.066 moles) of 3,3',4, 4'-biphenyltetracarboxylic dianhydride (BPDA) was added to the diamine solution contained within the reaction vessel. Stirring was continued until all of the solids dissolved and the reaction formed a polyamic acid solution. The polyamic acid solution was decanted and stored at 0° C. until used for film casting.

A polyimide film derived from the above polyamic acid was chemically imidized through the use of a catalytic solution. The chemically imidized film was prepared by casting the polyamic acid solution onto a support sheet of DuPont MYLAR® film. The cast polyamic acid solution (and support sheet) was immersed into a catalytic solution comprising a 1:1 ratio of acetic anhydride and fl-picoline. A gel film was formed. The gel film was peeled from the support sheet and transferred to a restraining frame (pin frame).

The gel film was then heated using a forced air oven to further imidize the polymer and remove solvent. The gel film was exposed to the following oven temperatures for about ½ hour at each temperature, 150° C., 250° C., 300° C. and 325° C. The polyimide film was removed from the pin frame and analyzed. The data is shown in Table 1.

Two sheets of the film were laminated between two sheets of 35 um thick treated copper foil in a vacuum platen press at 350 psi. The peel strength data was measured per IPC-TM650 2.4.9d test method. The data at different lamination peak temperatures are shown in Table 1.

Examples 2-12 show that a polyimide derived from 100 mole % BPDA, 20 to 90 mole % TFMB and 10 to 80 mole % 4,4'-ODA has a peel strength of at least 1 N/mm when laminated at a temperature of 330° C. or greater Example 2

BPDA/90 TFMB/10 ODA

Within a nitrogen inerted glovebox, 19.711 g (0.0615 moles) of 2,2'-bis(trifluoromethyl) benzidine (TFMB), 1.369 g (0.006 moles) 4,4'-oxydianiline, and 159 grams of N,N-dimethylacetamide (DMAc) were charged to a dried 250 milliliter jacketed beaker equipped with mechanical stirrer. The mixture was heated using recirculating 45° C. glycol-water for several minutes until the diamine had completely dissolved resulting in a near colorless solution. Next, 19.919 g (0.0677 moles) of 3,3',4,4'-biphenyltetracarboxylic dianhydride (BPDA) was added to the diamine solution contained within the reaction vessel. Stirring was continued until all of the solids dissolved and the reaction formed a polyamic acid solution. The polyamic acid solution was decanted and stored at 0° C. until used for film casting.

A polyimide film derived from the above polyamic acid was chemically imidized through the use of a catalytic solution. The chemically imidized film was prepared by casting the polyamic acid solution onto a support sheet of DuPont MYLAR® film. The cast polyamic acid solution (and support sheet) was immersed into a catalytic solution comprising a 1:1 ratio of acetic anhydride and β-picoline. A gel film was formed. The gel film was peeled from the support sheet and transferred to a restraining frame (pin frame).

The gel film was then heated using a forced air oven to further imidize the polymer and remove solvent. The gel film was exposed to the following oven temperatures for about hour at each temperature, 150° C., 250° C., 300° C. and 3250° C. The polyimide film was removed from the pin frame and analyzed. The data is shown in Table 1.

Two sheets of the film were laminated between two sheets of 35 um thick treated copper foil in a vacuum platen press at 350 psi. The peel strength data was measured per IPC-TM650 2.4.9d test method. The data at different lamination peak temperatures are shown in Table 1.

Example 3

BPDA/80 TFMB/20 ODA

Within a nitrogen inerted glovebox, 17.879 g (0.0558 moles) of 2,2'-bis(trifluoromethyl) benzidine (TFMB), 2.794 g (0.0139 moles) 4,4'-oxydianiline, and 159 grams of N,N-dimethylacetamide (DMAc) were charged to a dried 250 milliliter jacketed beaker equipped with mechanical stirrer. The mixture was heated using recirculating 45° C. glycol-water for several minutes until the diamine had completely dissolved resulting in a near colorless solution. Next, 20.326 g (0.069 moles) of 3,3',4,4'-biphenyltetracarboxylic dianhydride (BPDA) was added to the diamine solution contained within the reaction vessel. Stirring was continued until all of the solids dissolved and the reaction formed a polyamic acid solution. The polyamic acid solution was decanted and stored at 0° C. until used for film casting.

A polyimide film derived from the above polyamic acid was chemically imidized through the use of a catalytic solution. The chemically imidized film was prepared by casting the polyamic acid solution onto a support sheet of DuPont MYLAR® film. The cast polyamic acid solution (and support sheet) was immersed into a catalytic solution comprising a 1:1 ratio of acetic anhydride and β-picoline. A gel film was formed. The gel film was peeled from the support sheet and transferred to a restraining frame (pin frame).

The gel film was then heated using a forced air oven to further imidize the polymer and remove solvent. The gel film was exposed to the following oven temperatures for about ½ hour at each temperature, 150° C., 250° C., 300° C. and 3250° C. The film was removed from the pin frame and analyzed. The data is shown in Table 1.

Two sheets of the film were laminated between two sheets of 35 um thick treated copper foil in a vacuum platen press at 350 psi. The peel strength data was measured per IPC-TM650 2.4.9d test method. The data at different lamination peak temperatures are shown in Table 1.

Example 4

BPDA/70 TFMB/30 ODA

Within a nitrogen inerted glovebox, 15.971 g (0.0498 moles) of 2,2'-bis(trifluoromethyl) benzidine (TFMB), 4.279 g (0.0213 moles) 4,4'-oxydianiline, and 159 grams of N,N-dimethylacetamide (DMAc) were charged to a dried 250 milliliter jacketed beaker equipped with mechanical stirrer. The mixture was heated using recirculating 45° C. glycol-water for several minutes until the diamine had completely dissolved resulting in a near colorless solution. Next 20.75 g (0.0705 moles) of 3,3',4,4'-biphenyltetracarboxylic dianhydride (BPDA) was added to the diamine solution contained within the reaction vessel. Stirring was continued until all of the solids dissolved and the reaction formed a polyamic acid solution. The polyamic acid solution was decanted and stored at 0° C. until used for film casting.

A polyimide film derived from the above polyamic acid was chemically imidized through the use of a catalytic solution. The chemically imidized film was prepared by casting the polyamic acid solution onto a support sheet of DuPont MYLAR® film. The cast polyamic acid solution (and support sheet) was immersed into a catalytic solution comprising a 1:1 ratio of acetic anhydride and β-picoline. A gel film was formed. The gel film was peeled from the support sheet and transferred to a restraining frame (pin frame).

The gel film was then heated using a forced air oven to further imidize the polymer and remove solvent. The gel film was exposed to the following oven temperatures for about ½ hour at each temperature, 150° C., 250° C., 300° C. and 3250° C. The polyimide film was removed from the pin frame and analyzed. The data is shown in Table 1.

Two sheets of the film were laminated between two sheets of 35 um thick treated copper foil in a vacuum platen press at 350 psi. The peel strength data was measured per IPC-TM650 2.4.9d test method. The data at different lamination peak temperatures are shown in Table 1.

Example 5

BPDA/60 TFMB/40 ODA

Within a nitrogen inerted glovebox, 13.981 g (0.0436 moles) of 2,2'-bis(trifluoromethyl) benzidine (TFMB), 5.827 g (0.0291 moles) 4,4'-oxydianiline, and 159 grams of N,N-dimethylacetamide (DMAc) were charged to a dried 250 milliliter jacketed beaker equipped with mechanical stirrer. The mixture was heated using recirculating 45° C. glycol-water for several minutes until the diamine had completely dissolved resulting in a near colorless solution. Next, 21.192 g (0.0720 moles) of 3,3',4,4'-biphenyltetracarboxylic dianhydride (BPDA) was added to the diamine solution contained within the reaction vessel. Stirring was continued until all of the solids dissolved and the reaction formed a polyamic acid solution. The polyamic acid solution was decanted and stored at 0° C. until used for film casting.

A polyimide film derived from the above polyamic acid was chemically imidized through the use of a catalytic solution. The chemically imidized film was prepared by casting the polyamic acid solution onto a support sheet of DuPont MYLAR® film. The cast polyamic acid solution (and support sheet) was immersed into a catalytic solution comprising a 1:1 ratio of acetic anhydride and β-picoline. A gel film was formed. The gel film was peeled from the support sheet and transferred to a restraining frame (pin frame).

The gel film was then heated using a forced air oven to further imidize the polymer and remove solvent. The gel film was exposed to the following oven temperatures for about ½ hour at each temperature, 150° C., 250° C., 300° C.

and 325° C. The resulting polyimide film was removed from the pin frame and analyzed. The data is shown in Table 1.

Two sheets of the film were laminated between two sheets of 35 um thick treated copper foil in a vacuum platen press at 350 psi. The peel strength data was measured per IPC-TM650 2.4.9d test method. The data at different lamination peak temperatures are shown in Table 1.

Example 6

BPDA/50 TFMB/50 ODA

Within a nitrogen inerted glovebox, 11.904 g (0.03717 moles) of 2,2'-bis(trifluoromethyl) benzidine (TFMB), 7.442 g (0.0371 moles) 4,4'-oxydianiline, and 159 grams of N,N-dimethylacetamide (DMAc) were charged to a dried 250 milliliter jacketed beaker equipped with mechanical stirrer. The mixture was heated using recirculating 45° C. glycol-water for several minutes until the diamine had completely dissolved resulting in a near colorless solution. Next, 21.654 g (0.0736 moles) of 3,3',4,4'-biphenyltetracarboxylic dianhydride (BPDA) was added to the diamine solution contained within the reaction vessel. Stirring was continued until all of the solids dissolved and the reaction formed a polyamic acid solution. The polyamic acid solution was decanted and stored at 0° C. until used for film casting.

A polyimide film derived from the above polyamic acid was chemically imidized through the use of a catalytic solution. The chemically imidized film was prepared by casting the polyamic acid solution onto a support sheet of DuPont MYLAR® film. The cast polyamic acid solution (and support sheet) was immersed into a catalytic solution comprising a 1:1 ratio of acetic anhydride and β-picoline. A gel film was formed. The gel film was peeled from the support sheet and transferred to a restraining frame (pin frame).

The gel film was then heated using a forced air oven to further imidize the polymer and remove solvent. The gel film was exposed to the following oven temperatures for about ½ hour at each temperature, 150° C., 250° C., 300° C. and 325° C. The film was removed from the pin frame and analyzed. The data is shown in Table 1.

Two sheets of the film were laminated between two sheets of 35 um thick treated copper foil in a vacuum platen press at 350 psi. The peel strength data was measured per IPC-TM650 2.4.9d test method. The data at different lamination peak temperatures are shown in Table 1.

Example 7

BPDA/43 TFMB/57 ODA

Into a dried 50 gallon tank, equipped with nitrogen inlet, three independently controlled agitator shafts; a low speed anchor mixer, a high speed disk disperser, and a high shear rotor-stator emulsifier, and thermocouple, was placed 10.10 kg (31.54 moles) of 2,2'-bis(trifluoromethyl) benzidine (TFMB), 8.37 kg (41.81 moles) 4,4'-oxydianiline (ODA), and 159.6 kg of N,N-dimethylacetamide (DMAc).

The mixture was heated and stirred at 35° C. for several minutes until the diamines had completely dissolved resulting in a straw colored solution. The speeds of the anchor, disperser, and emulsifier are adjusted as needed to ensure efficient mixing and dissolution, without excessively heating the mixture. Next, 21.4 kg (72.84 moles) of 3,3',4,4'-biphenyltetracarboxylic dianhydride (BPDA) was added to the diamine solution within the reaction vessel. Stirring was continued until all of the solids dissolved and the reaction formed a polyamic acid solution. The viscosity of the resulting polyamic acid solution was adjusted by chain extension through an addition of a stoichiometric amount of 6 wt % PMDA solution in DMAc or alternatively an equivalent stoichiometric amount of BPDA solids so that the resulting solution had a viscosity of about 2000 poise. The finished solution is filtered through a 20 micron bag filter and vacuum degassed to remove entrained air. The polyamic acid solution was cooled to approximately −6° C., acetic anhydride dehydrating agent (0.14 cm$^3$/cm$^3$ polymer solution), the imidization catalyst 3-picoline (0.15 cm$^3$/cm$^3$ polymer solution) were metered in and mixed, and a film was cast using a slot die, onto a 90° C. hot, rotating drum. The resulting gel film was stripped off the drum and fed into a tenter oven, where it was dried and cured to a solids level greater than 98%, using convective and radiant heating.

Two sheets of the film were laminated between two sheets of 35 micron thick treated copper foil in a vacuum platen press at 350 psi. The peel strength data was measured per IPC-TM650 2.4.9d test method. The data at different lamination peak temperatures are shown in Table 1.

Two more sheets of film were laminated between two sheets of 35 micron thick treated copper foil in a vacuum platen press at 350 psi. The dimensional stability of these clads were measured per IPC-TM650 2.2.4c. The results are summarized in Table 2.

Example 8

BPDA/50 TFMB/50 ODA

Into a dried 50 gallon tank, equipped with nitrogen inlet, three independently controlled agitator shafts; a low speed anchor mixer, a high speed disk disperser, and a high shear rotor-stator emulsifier, and thermocouple was placed 11.56 kg (36.12 moles) of 2,2'-bis(trifluoromethyl) benzidine (TFMB), 7.23 kg (36.12 moles) 4,4'-oxydianiline (ODA), and 159.6 kg of N,N-dimethylacetamide (DMAc). The mixture was heated and stirred at 35° C. for several minutes until the diamines had completely dissolved resulting in a straw colored solution. The speeds of the anchor, disperser, and emulsifier are adjusted as needed to ensure efficient mixing and dissolution, without excessively heating the mixture. Next, 21.1 kg (71.73 moles) of 3,3',4,4'-biphenyltetracarboxylic dianhydride (BPDA) was added to the diamine solution within the reaction vessel. Stirring was continued until all of the solids dissolved and the reaction formed a polyamic acid solution. The viscosity of the resulting polyamic acid solution was adjusted by chain extension through an addition of a stoichiometric amount of 6 wt % PMDA solution in DMAc or alternatively an equivalent stoichiometric amount of BPDA solids so that the resulting solution had a viscosity of about 1500 poise. Finally, a small amount of belt release agent was added to the polyamic acid solution (which enables the cast green film to be readily stripped from the casting belt) A thin polymer film was produced by extruding the film through a slot die onto a moving stainless steel belt. The belt passes into a convective oven, to evaporate solvent and partially imidizing the polymer, to produce a "green" film. Green film solids (as measured by weight loss upon heating to 300° C.) was ~70%. The green film was then stripped off the casting belt and wound up. The green film was then fed into a tenter oven where it was dried and cured to a solids level greater than 98%, using convective and radiant heating to produce a fully cured polyimide film. During tentering, shrinkage was controlled by constraining the film along the edges.

Two sheets of the polyimide film were laminated between two sheets of 35 um thick treated copper foil in a vacuum platen press at 200 and 350 psi. The peel strength data was measured per IPC-TM650 2.4.9d test method. The data at different lamination peak temperatures are shown in Table 1.

Example 9

BPDA/43 TFMB/57 ODA

With the polyamic acid polymer solution prepared as described in example 7, a thin film was prepared by casting a portion of the solution onto a copper foil (12 um Mitsui 3EC-M35-HTE ED copper) using a doctor blade. The coated copper foil was then restrained within a clip frame film and heated using a forced air oven to remove the solvent and imidize the polymer. The film was exposed to the following oven temperatures for about ½ hour, 150° C., 250° C., and 330° C. The resulting single sided copper coated polyimide was then removed from the clip frame and then laminated to another sheet of copper foil of the same specification as described above in a vacuum platen press at 350 psi pressure and a temperature of 350° C. The peel strength data was measured per IPC-TM650 2.4.9d test method. The data is shown in Table 1.

Example 10

Prophetic

BPDA/50 TFMB/50 ODA

Into a dried 50 gallon tank, equipped with nitrogen inlet, three independently controlled agitator shafts; a low speed anchor mixer, a high speed disk disperser, and a high shear rotor-stator emulsifier, and thermocouple is placed 11.56 kg (36.12 moles) of 2,2'-bis(trifluoromethyl) benzidine (TFMB), 7.23 kg (36.12 moles) 4,4'-oxydianiline (ODA), and 159.6 kg of N,N-dimethylacetamide (DMAc).

The mixture is heated and stirred at 35° C. for several minutes until the diamines are completely dissolved resulting in a straw colored solution. The speeds of the anchor, disperser, and emulsifier can be adjusted as needed to ensure efficient mixing and dissolution, without excessively heating the mixture. Next, 21.1 kg (71.73 moles) of 3,3',4,4'-biphenyltetracarboxylic dianhydride (BPDA) is added to the diamine solution within the reaction vessel. Stirring is continued until all of the solids dissolved and the reaction forms a polyamic acid solution. The viscosity of the resulting polyamic acid solution is adjusted by chain extension through an addition of a stoichiometric amount of 6 wt % PMDA solution in DMAc or alternatively an equivalent stoichiometric amount of BPDA solids so that the resulting solution has a viscosity of about 2000 poise. The finished solution can be filtered through a 20 micron bag filter and vacuum degassed to remove entrained air. The polyamic acid solution is cooled to approximately −6° C., acetic anhydride dehydrating agent (0.14 cm$^3$/cm$^3$ polymer solution), the imidization catalyst 3-picoline (0.15 cm$^3$/cm$^3$ polymer solution) is metered in and mixed, and a film is cast using a slot die, onto a 90° C. hot, rotating drum. The resulting gel film is stripped off the drum and fed into a tenter oven, where it is dried and cured to a solids level greater than 98%, using convective and radiant heating.

Two sheets of the film are laminated between two sheets of 35 um thick treated copper foil in a vacuum platen press at 350 psi. It is expected that the laminate would have good peel strength measured per IPC-TM650 2.4.9d test method.

Example 11

BPDA/30 TFMB/70 ODA

Within a nitrogen inerted glovebox, 7.265 g (0.02268 moles) of 2,2'-bis(trifluoromethyl) benzidine (TFMB), 10.598 g (0.0529 moles) 4,4'-oxydianiline, and 160 grams of N,N-dimethylacetamide (DMAc) were charged to a dried 250 milliliter jacketed beaker equipped with mechanical stirrer. The mixture was heated using recirculating 45° C. glycol-water for several minutes until the diamine had completely dissolved resulting in a near colorless solution. Next, 22.137 g (0.0752 moles) of 3,3',4,4'-biphenyltetracarboxylic dianhydride (BPDA) was added to the diamine solution contained within the reaction vessel. Stirring was continued until all of the solids dissolved and the reaction formed a polyamic acid solution. The polyamic acid solution was decanted and stored at 0° C. until used for film casting.

A polyimide film derived from the above polyamic acid was chemically imidized through the use of a catalytic solution. The chemically imidized film was prepared by casting the polyamic acid solution onto a support sheet of DuPont MYLAR® film. The cast polyamic acid solution (and support sheet) was immersed into a catalytic solution comprising a 1:1 ratio of acetic anhydride and fl-picoline. A gel film was formed. The gel film was peeled from the support sheet and transferred to a restraining frame (pin frame).

The gel film was then heated using a forced air oven to further imidize the polymer and remove solvent. The gel film was exposed to the following oven temperatures for about ½ hour at each temperature, 150° C., 250° C., 300° C. and 325° C. The polyimide film was removed from the pin frame and analyzed. The data is shown in Table 1.

Two sheets of the film were laminated between two sheets of 35 um thick treated copper foil in a vacuum platen press at 350 psi. The peel strength data was measured per IPC-TM650 2.4.9d test method. The data at different lamination peak temperatures are shown in Table 1.

Example 12

BPDA/20 TFMB/80 ODA

Within a nitrogen inerted glovebox, 5.358 g (0.0167 moles) of 2,2'-bis(trifluoromethyl) benzidine (TFMB), 13.399 g (0.0669 moles) 4,4'-oxydianiline, and 172 grams of N,N-dimethylacetamide (DMAc) were charged to a dried 250 milliliter jacketed beaker equipped with mechanical stirrer. The mixture was heated using recirculating 45° C. glycol-water for several minutes until the diamine had completely dissolved resulting in a near colorless solution. Next, 24.243 g (0.0824 moles) of 3,3',4,4'-biphenyltetracarboxylic dianhydride (BPDA) was added to the diamine solution contained within the reaction vessel. Stirring was continued until all of the solids dissolved and the reaction formed a polyamic acid solution. The polyamic acid solution was decanted and stored at 0° C. until used for film casting.

A polyimide film derived from the above polyamic acid was chemically imidized through the use of a catalytic solution. The chemically imidized film was prepared by casting the polyamic acid solution onto a support sheet of DuPont MYLAR® film. The cast polyamic acid solution (and support sheet) was immersed into a catalytic solution comprising a 1:1 ratio of acetic anhydride and f#-picoline. A gel film was formed. The gel film was peeled from the support sheet and transferred to a restraining frame (pin frame).

The gel film was then heated using a forced air oven to further imidize the polymer and remove solvent. The gel film was exposed to the following oven temperatures for about hour at each temperature, 150° C., 250° C., 300° C. and 325° C. The polyimide film was removed from the pin frame and analyzed. The data is shown in Table 1.

Two sheets of the film were laminated between two sheets of 35 um thick treated copper foil in a vacuum platen press at 350 psi. The peel strength data was measured per IPC-TM650 2.4.9d test method. The data at different lamination peak temperatures are shown in Table 1.

Example 13

Example 13 shows polyimides of the present disclosure have good conformation over circuitry and are useful as a coverlay.

A sheet of Pyralux® AP flexible copper clad laminate with 18 micron thick copper foil (available from DuPont) was imaged with photoresist and copper etching to created imaged copper foil lines of different widths using standard procedures in the flexible printed circuit board industry. The polymer created in example 7 (film thickness 32 microns) was laminated over the imaged circuit lines to form a coverlay over the imaged flexible circuit. The polyimide coverlay was laminated in a vacuum platen press at 350 psi and 320 C peak lamination temperature. The polyimide coverlay showed very good conformation over the circuitry with no air voids observed. The polyimide coverlay was able to cover the top of the circuitry with very little thinning.

Example 14

Example 14 shows polyimides of the present disclosure are have good peel strength when laminated at a temperature of 320° C.

Two sheets of Pyralux® AP flexible copper clad laminate (available from DuPont) was imaged with photoresist and copper etching to remove all of the copper foil from one side of the Pyralux® AP using processing common in the flexible printed circuit board industry. The polymer created in example 7 (50 um thick) was laminated between the between the two imaged Pyralux® AP clads where the dielectric surface of the AP clad was laminated to the polymer film of example 7. The polyimide film was laminated in a vacuum platen press at 350 psi and 320° C. peak lamination temperature. The peel strength between the AP dielectric surface and the polyimide film of example 7 was measured per IPC-TM650-2.4.9d. Peels strength of 1.4 N/mm between the AP dielectric and the polyimide film of example 7

Example 15

Example 15 shows polyimides of the present disclosure have good conformation over circuitry and are useful as a bondply.

Two sheets of Pyralux® AP flexible copper clad laminate with 18 micron thick copper foil (available from DuPont) were imaged with photoresist and copper etching to created imaged copper foil lines of different widths using standard procedures in the flexible printed circuit board industry. The polymer created in example 7 (film thickness of 100 microns) was laminated over the imaged circuit lines of the two imaged AP clads to form a bondply between the two imaged flexible circuits. The polyimide bondply was laminated in a vacuum platen press at 350 psi and 320 C peak lamination temperature. The polymer bondply showed very good conformation over the circuitry with no air voids observed. The polyimide bondply, was able to separate the circuitry on the two AP imaged laminates with very little thinning between the two imaged circuits.

Example 16

Example 16 shows that good peel strength is achieved with metal alloys.

Two sheets the film made in example 7 above were laminated between two sheets of Inconel® 600 metal alloy foil (25 microns thick), available from Ulrich. The peel strength data was measured per IPC-TM650 2.4.9d test method. An average peel strength of 1.8 N/mm was measured.

Comparative Example 1

BPDA/ODA

Comparative example 1 shows eliminating TFMB compromises properties, including peel strength.

Within a nitrogen inerted glovebox, 16.702 g (0.0834 moles) 4,4'-oxydianiline, and 159 grams of N,N-dimethylacetamide (DMAc) were charged to a dried 250 milliliter jacketed beaker equipped with mechanical stirrer. The mixture was heated using recirculating 45° C. glycol-water for several minutes until the diamine had completely dissolved resulting in a near colorless solution. Next, 24.298 g (0.08266 moles) of 3,3',4,4'-biphenyltetracarboxylic dianhydride (BPDA) was added to the diamine solution contained within the reaction vessel. Stirring was continued until all of the solids dissolved and the reaction formed a polyamic acid solution. The polyamic acid solution was decanted and stored at 0° C. until used for film casting.

A polyimide film derived from the above polyamic acid was chemically imidized through the use of a catalytic solution. The chemically imidized film was prepared by casting the polyamic acid solution onto a support sheet of DuPont MYLAR® film. The cast polyamic acid solution (and support sheet) was immersed into a catalytic solution comprising a 1:1 ratio of acetic anhydride and fl-picoline. A gel film was formed. The gel film was peeled from the support sheet and transferred to a restraining frame (pin frame).

The gel film was then heated using a forced air oven to further imidize the polymer and remove solvent. The gel film was exposed to the following oven temperatures for about ½ hour at each temperature, 150° C., 250° C., 300° C. and 325° C. The resulting polyimide film was removed from the pin frame and analyzed. The data is shown in Table 1.

Two sheets of the film were laminated between two sheets of 35 um thick treated copper foil in a vacuum platen press at 350 psi. The peel strength data was measured per IPC-TM650 2.4.9d test method. The data at different lamination peak temperatures are shown in Table 1.

Comparative Example 2

54BPDA/46PMDA/ODA

Comparative example 2 shows that even though the film can be thermoformed, it has poor adhesion to copper.

Within a nitrogen inerted glovebox, 18.225 g (0.0910 moles) 4,4'-oxydianiline, and 159 grams of N,N-dimethylacetamide (DMAc) were charged to a dried 250 milliliter jacketed beaker equipped with mechanical stirrer. The mixture was heated using recirculating 45° C. glycol-water for several minutes until the diamine had completely dissolved resulting in a near colorless solution. Next, an admixture of 12.052 g (0.0409 moles) of 3,3',4,4'-biphenyltetracarboxylic dianhydride (BPDA) and 10.723 g (0.0492) pyromellitic dianhydride (PMDA) was added to the diamine solution contained within the reaction vessel. Stirring was continued until all of the solids dissolved and the reaction formed a polyamic acid solution. The polyamic acid solution was decanted and stored at 0° C. until used for film casting.

A polyimide film derived from the above polyamic acid was chemically imidized through the use of a catalytic solution. The chemically imidized film was prepared by casting the polyamic acid solution onto a support sheet of DuPont MYLAR® film. The cast polyamic acid solution (and support sheet) was immersed into a catalytic solution comprising a 1:1 ratio of acetic anhydride and β-picoline. A gel film was formed. The gel film was peeled from the support sheet and transferred to a restraining frame (pin frame).

The gel film was then heated using a forced air oven to further imidize the polymer and remove solvent. The gel film was exposed to the following oven temperatures for about ½ hour at each temperature, 150° C., 250° C. 300° C. and 325° C. The resulting polyimide film was removed from the pin frame and analyzed. The data is shown in Table 1.

Two sheets of the film were laminated between two sheets of 35 um thick treated copper foil in a vacuum platen press at 350 psi. The peel strength data was measured per IPC-TM650 2.4.9d test method. The data at different lamination peak temperatures are shown in Table 1.

Comparative Example 3

PMDA/TFMB

Comparative example 3 shows when BPDA is replaced with PMDA the polyimide is brittle and has poor peel strength.

Within a nitrogen inerted glovebox, 24.552 g (0.0767 moles) of 2,2'-bis(trifluoromethyl) benzidine (TFMB) and 159 grams of N,N-dimethylacetamide (DMAc) were charged to a dried 250 milliliter jacketed beaker equipped with mechanical stirrer. The mixture was heated using recirculating 45° C. glycol-water for several minutes until the diamine had completely dissolved resulting in a near colorless solution. Next, 16.55 g (0.0759 moles) of pyromellitic dianhydride (PMDA) was added to the diamine solution contained within the reaction vessel. Stirring was continued until all of the solids dissolved and the reaction formed a polyamic acid solution. The polyamic acid solution was decanted and stored at 0° C. until used for film casting.

A polyimide film derived from the above polyamic acid was chemically imidized through the use of a catalytic solution. The chemically imidized film was prepared by casting the polyamic acid solution onto a support sheet of DuPont MYLAR® film. The cast polyamic acid solution (and support sheet) was immersed into a catalytic solution comprising a 1:1 ratio of acetic anhydride and β-picoline. A gel film was formed. The gel film was peeled from the support sheet and transferred to a restraining frame (pin frame).

The gel film was then heated using a forced air oven to further imidize the polymer and remove solvent. The gel film was exposed to the following oven temperatures for about ½ hour, 150° C., 250° C., 300° C. and 325° C. The resulting polyimide film was removed from the pin frame and analyzed. The data is shown in Table 1.

Two sheets of the film were laminated between two sheets of 35 um thick treated copper foil in a vacuum platen press at 350 psi. The peel strength data was measured per IPC-TM650 2.4.9d test method. The data at different lamination peak temperatures are shown in Table 1.

Comparative Example 4

BPDA/50mTOL/50ODA

Comparative example 4 shows that replacing TFMB with a chemically similar diamine but with 2,2'-methyl benzidine functionality does not yield equivalent peel strength.

Within a nitrogen inerted glovebox, 8.77 g (0.0413 moles) of 2,2'-dimethyl-4,4'-diaminobiphenyl, 8.271 g (0.0413 moles) 4,4'-oxydianiline, and 159 grams of N,N-dimethylacetamide (DMAc) were charged to a dried 250 milliliter jacketed beaker equipped with mechanical stirrer. The mixture was heated using recirculating 45° C. glycol-water for several minutes until the diamine had completely dissolved resulting in a near colorless solution. Next, 24.065 g (0.0818 moles) of 3,3',4,4'-biphenyltetracarboxylic dianhydride (BPDA) was added to the diamine solution contained within the reaction vessel. Stirring was continued until all of the solids dissolved and the reaction formed a polyamic acid solution. The polyamic acid solution was decanted and stored at 0° C. until used for film casting.

A polyimide film derived from the above polyamic acid was chemically imidized through the use of a catalytic solution. The chemically imidized film was prepared by casting the polyamic acid solution onto a support sheet of DuPont MYLAR® film. The cast polyamic acid solution (and support sheet) was immersed into a catalytic solution comprising a 1:1 ratio of acetic anhydride and f-picoline. A gel film was formed. The gel film was peeled from the support sheet and transferred to a restraining frame (pin frame).

The gel film was then heated using a forced air oven to further imidize the polymer and remove solvent. The gel film was exposed to the following oven temperatures for about ½ hour at each temperature, 150° C., 2500° C., 300° C. and 325° C. The resulting polyimide film was removed from the pin frame and analyzed. The data is shown in Table 1.

Two sheets of the film were laminated between two sheets of 35 um thick treated copper foil in a vacuum platen press at 350 psi. The peel strength data was measured per IPC-TM650 2.4.9d test method. The data at different lamination peak temperatures are shown in Table 1.

Comparative Example 5

20PMDA/80ODPA/RODA

Comparative example 5 has poor mechanical properties.

Into a dried 50 gallon tank, equipped with nitrogen inlet, three independently controlled agitator shafts: a low speed anchor mixer, a high speed disk disperser, and a high shear rotor-stator emulsifier, and thermocouple was placed 20.02 kg (68.49 moles) of 1,3-bis(4-aminophenoxy)benzene (RODA) and 159.6 kg of N,N-dimethylacetamide (DMAc).

The mixture was heated and stirred at 35° C. for several minutes until the diamines had completely dissolved resulting in a straw colored solution. The speeds of the anchor, disperser, and emulsifier are adjusted as needed to ensure efficient mixing and dissolution, without excessively heating the mixture. Next, 16.99 kg (54.79 moles) of 4,4'-oxydiphthalic anhydride (ODPA) and 2.88 kg (13.21 moles) pyromellitic dianhydride (PMDA) was added to the diamine solution within the reaction vessel. Stirring was continued until all of the solids dissolved and the reaction formed a polyamic acid solution. The viscosity of the resulting polyamic acid solution was adjusted by chain extension through an addition of a stoichiometric amount of 6 wt % PMDA solution in DMAc or alternatively an equivalent stoichiometric amount of BPDA solids so that the resulting solution had a viscosity of about 2000 poise. The finished solution is filtered through a 20 micron bag filter and vacuum degassed to remove entrained air. The polyamic acid solution was cooled to approximately −6° C., acetic anhydride dehydrating agent (0.14 $cm^3/cm^3$ polymer solution), the imidization catalyst 3-picoline (0.15 $cm^3/cm^3$ polymer solution) were metered in and mixed, and a film was cast using a slot die, onto a 90° C. hot, rotating drum. The resulting gel film was stripped off the drum and fed into a tenter oven, where it was dried and cured to a solids level greater than 98%, using convective and radiant heating.

Two sheets of the film were laminated between two sheets of 35 um thick treated copper foil in a vacuum platen press at 350 psi. The peel strength data was measured per IPC-TM650 2.4.9d test method. The data at different lamination peak temperatures are shown in Table 1.

Two more sheets of film were laminated between two sheets of 35 um thick treated copper foil in a vacuum platen press at 350 psi. The dimensional stability of these clads were measured per IPC-TM650 2.2.4c. The results are summarized in Table 2.

Comparative Example 6

PMDA/ODA

Comparative example 6 has poor peel strength.

Two sheets of Kapton® H film (type 100PFC available from DuPont), a polyimide comprised of pyromellitic dianyhdride (PMDA) and 4,4'-oxydianiline (ODA), was obtained from E. I. du Pont de Nemours and Company were laminated between two sheets of 35 um thick treated copper foil in a vacuum platen press at 350 psi. The peel strength data was measured per IPC-TM650 2.4.9d test method. The data at different lamination peak temperatures are shown in Table 1.

Comparative Example 7

60PMDA/40BPDA/40ODA/60PPD

Comparative example 7 has poor peel strength.

Two sheets of Kapton® E film (available from DuPont), a copolyimide comprised of pyromellitic dianhydride (PMDA), 3',4,4'-biphenyltetracarboxylic dianhydride (BPDA), 4,4'-oxydianiline (ODA), and 1,4-phenylene diamine (PPD), was obtained from E. I. du Pont de Nemours and Company. were laminated between two sheets of 35 um thick treated copper foil in a vacuum platen press at 350 psi. The peel strength data was measured per IPC-TM650 2.4.9d test method. The data at different lamination peak temperatures are shown in Table 1.

Examples 17 and 18 show that a polyimide derived from 80-90 mole % BPDA, 10 to 20 mole % ODPA and 100 mole % TFMB has a peel of at least 1.3 N/mm when laminated at a temperature of 350° C. or greater.

Example 17

90 BPDA/10 ODPA/TFMB

Into a dried 250 mL jacketed beaker equipped with mechanical stirrer within an inerted nitrogen glovebox was placed 20.68 g (0.064 moles) of 2,2'-bis(trifluoromethyl) benzidine (TFMB) and 156 g of N,N-dimethylacetamide (DMAc).

The mixture was heated and stirred at 40° C. for several minutes until the diamine had completely dissolved resulting in a straw colored solution. Next, 16.91 g (0.057 moles) of 3,3',4,4'-biphenyltetracarboxylic dianhydride (BPDA) and 1.41 g (0.006 moles) of 4,4'-oxydiphthalic anhydride (ODPA) were added to the diamine solution within the reaction vessel.

Stirring was continued until all of the solids dissolved and the reaction formed a polyamic acid solution. The viscosity of the resulting polyamic acid solution was adjusted by chain extension through an addition of a stoichiometric amount of 6 wt % PMDA solution in DMAc or alternatively an equivalent stoichiometric amount of BPDA solids so that the resulting solution had a viscosity of about 2000 poise. The solution was decanted and stored at 0° C. until used for film casting.

A polyimide film derived from the above polyamic acid was chemically imidized through the use of a catalytic solution. The chemically imidized film was prepared by casting the polyamic acid solution onto a sheet of DuPont MYLAR® film. The polymer (and support sheet) was immersed into a catalytic solution comprising a 1:1 ratio of acetic anhydride and β-picoline. Within minutes (upon partial imidization), a gel film was formed. The gel film was peeled from the support sheet and transferred to a restraining frame (pin frame).

The film was then heated using a forced air oven to further imidize the polymer and remove solvent. The film was exposed to the following oven temperatures for about ½ hour, 150° C., 250° C., and 330° C. The film was removed from the pin frame and analyzed.

Two sheets of the film were laminated between two sheets of 35 um thick treated copper foil in a vacuum platen press at 350 psi. The peel strength data was measured per IPC-TM650 2.4.9d test method. The data at different lamination peak temperatures are shown in Table 1.

Example 18

80 BPDA/20 ODPA/TFMB

Into a dried 200 mL jacketed beaker equipped with mechanical stirrer within an inerted nitrogen glovebox was placed 20.94 g (0.065 moles) of 2,2'-bis(trifluoromethyl) benzidine (TFMB) and 156 g of N,N-dimethylacetamide (DMAc).

The mixture was heated and stirred at 400° C. for several minutes until the diamine had completely dissolved resulting in a straw colored solution. Next, 15.20 g (0.051 moles) of 3,3',4,4'-biphenyltetracarboxylic dianhydride (BPDA) and 2.85 g (0.013 moles) of 4,4'-oxydiphthalic anhydride (ODPA) were added to the diamine solution within the reaction vessel.

Stirring was continued until all of the solids dissolved and the reaction formed a polyamic acid solution. The viscosity of the resulting polyamic acid solution was adjusted by chain extension through an addition of a stoichiometric amount of 6 wt % PMDA solution in DMAc or alternatively an equivalent stoichiometric amount of BPDA solids so that the resulting solution had a viscosity of about 2000 poise. The solution was decanted and stored at 0° C. until used for film casting.

A polyimide film derived from the above polyamic acid was chemically imidized through the use of a catalytic solution. The chemically imidized film was prepared by casting the polyamic acid solution onto a sheet of DuPont MYLAR® film. The polymer (and support sheet) was immersed into a catalytic solution comprising a 1:1 ratio of acetic anhydride and β-picoline. Within minutes (upon partial imidization), a gel film was formed. The gel film was peeled from the support sheet and transferred to a restraining frame (pin frame).

The film was then heated using a forced air oven to further imidize the polymer and remove solvent. The film was exposed to the following oven temperatures for about ½ hour, 150° C., 250° C., and 330° C. The film was removed from the pin frame and analyzed.

Two sheets of the film were laminated between two sheets of 35 um thick treated copper foil in a vacuum platen press at 350 psi. The peel strength data was measured per IPC-TM650 2.4.9d test method. The data at different lamination peak temperatures are shown in Table 1.

Comparative Example 8

60 BPDA/40 ODPA/TFMB

Comparative example 8 shows a film could not me made for testing when 40 mole percent of ODPA is used.

Within a nitrogen inerted glovebox, 23.912 g (0.0746 moles) of 2,2'-bis(trifluoromethyl) benzidine (TFMB) and 179 grams of N,N-dimethylacetamide (DMAc) were charged to a dried 250 milliliter jacketed beaker equipped with mechanical stirrer. The mixture was heated using recirculating 45° C. glycol-water for several minutes until the diamine had completely dissolved resulting in a near colorless solution. Next, 13.18 g (0.045 moles) of 3,3',4,4'-biphenyltetracarboxylic dianhydride (BPDA) and 9.03 g (0.029 moles) 4,4'-oxydiphthalic anhydride (ODPA) was added to the diamine solution as an admixture contained within the reaction vessel. Stirring was continued until all of the solids dissolved and the reaction formed a polyamic acid solution. The polyamic acid solution was decanted and stored at 0° C. until used for film casting.

A polyimide film derived from the above polyamic acid was chemically imidized through the use of a catalytic solution. The chemically imidized film was prepared by casting the polyamic acid solution onto a support sheet of DuPont MYLAR® film. The cast polyamic acid solution (and support sheet) was immersed into a catalytic solution comprising a 1:1 ratio of acetic anhydride and f-picoline. A gel film was formed. The gel film was peeled from the support sheet and transferred to a restraining frame (pin frame).

The gel film was then heated using a forced air oven to further imidize the polymer and remove solvent. The gel film was exposed to the following oven temperatures for about ½ hour at each temperature, 150° C., 250° C., 300° C. and 325° C. A viable polyimide film to conduct testing on could not be obtained using this procedure due extreme wrinkling, curl, and tear-out from the restraining frame after cure.

Comparative Example 9

BPDA/10 TFMB/90 ODA

Comparative example 9 shows when 10 mole percent of TFMB is used the peel strength is low when laminated at 350 degrees C.

Within a nitrogen inerted glovebox, 2.675 g (0.00835 moles) of 2,2'-bis(trifluoromethyl) benzidine (TFMB), 15.049 g (0.071 moles) 4,4'-oxydianiline, and 168 grams of N,N-dimethylacetamide (DMAc) were charged to a dried 250 milliliter jacketed beaker equipped with mechanical stirrer. The mixture was heated using recirculating 45° C. glycol-water for several minutes until the diamine had completely dissolved resulting in a near colorless solution. Next, 24.27 g (0.083 moles) of 3,3',4,4'-biphenyltetracarboxylic dianhydride (BPDA) was added to the diamine solution contained within the reaction vessel. Stirring was continued until all of the solids dissolved and the reaction formed a polyamic acid solution. The polyamic acid solution was decanted and stored at 0° C. until used for film casting.

A polyimide film derived from the above polyamic acid was chemically imidized through the use of a catalytic solution. The chemically imidized film was prepared by casting the polyamic acid solution onto a support sheet of DuPont MYLAR® film. The cast polyamic acid solution (and support sheet) was immersed into a catalytic solution comprising a 1:1 ratio of acetic anhydride and β-picoline. A gel film was formed. The gel film was peeled from the support sheet and transferred to a restraining frame (pin frame).

The gel film was then heated using a forced air oven to further imidize the polymer and remove solvent. The gel film was exposed to the following oven temperatures for about ½ hour at each temperature, 150° C., 250° C., 300° C. and 3250° C. The polyimide film was removed from the pin frame and analyzed. The data is shown in Table 1.

Two sheets of the film were laminated between two sheets of 35 um thick treated copper foil in a vacuum platen press at 350 psi. The peel strength data was measured per IPC-TM650 2.4.9d test method. The data at different lamination peak temperatures are shown in Table 1.

Note that not all of the activities described above in the general description or the examples are required, that a portion of a specific activity may not be required, and that further activities may be performed in addition to those described. Still further, the order in which each of the activities are listed are not necessarily the order in which they are performed. After reading this specification, skilled artisans will be capable of determining what activities can be used for their specific needs or desires.

In the foregoing specification, the invention has been described with reference to specific embodiments. However, one of ordinary skill in the art appreciates that various modifications and changes can be made without departing from the scope of the invention as set forth in the claims below. All features disclosed in this specification may be replaced by alternative features serving the same, equivalent or similar purpose. Accordingly, the specification is to be regarded in an illustrative rather than a restrictive sense and all such modifications are intended to be included within the scope of the invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims.

TABLE 1

| EXAMPLE # | | Tg [tan delta] | MD CTE [50-250° C.] | MD Tensile Modulus | MD Tensile Strength | MD Elongation |
|---|---|---|---|---|---|---|
| 1 | BPDA//TFMB | 347 | 11 | 1289 | 47 | 30 |
| 2 | BPDA//90 TFMB/10 ODA | 308.6 | 9.1 | 724 | 32.4 | 52.2 |
| 3 | BPDA//80 TFMB/20 ODA | 323 | 15.3 | 716 | 37.8 | 72.7 |
| 4 | BPDA//70 TFMB/30 ODA | 314 | 15 | 728 | 42.73 | 110.5 |
| 5 | BPDA//60 TFMB/40 ODA | 295.6 | 15.9 | 665 | 38 | 106 |
| 6 | BPDA//50 TFMB/50 ODA | 288.1 | 12.6 | 663 | 35.5 | 105 |
| 7 | BPDA//43 TFMB/57 ODA | | | | | |
| 8 | BPDA//50 TFMB/50 ODA 350 psi 200 psi | | | | | |
| 9 | BPDA//43 TFMB/57 ODA | | | | | |
| 10 | BPDA//50 TFMB/50 ODA | | | | | |
| 11 | BPDA//30 TFMB/70 ODA | | | | | |
| 12 | BPDA//20 TFMB/80 ODA | | | | | |
| Comp 1 | BPDA//ODA | 292 | 31 | 377 | 24.9 | 80 |
| Comp 2 | 54BPDA/46PMDA//ODA | 314 | 41 | 425 | 29 | 120 |
| Comp 3 | PMDA//TFMB | 400 | −14 | 1600 | 72 | 25 |
| Comp 4 | BPDA//50mTOL/50ODA | 313 | 26 | 687 | 39 | 66 |
| Comp 5 | 20PMDA/80ODPA//RODA | 236 | >100 | 516 | 16.8 | 71.8 |
| Comp 6 | PMDA//ODA | | | | | |
| Comp 7 | 60PMDA/40BPDA// 40ODA/60PPD | | | | | |
| 17 | 90BPDA/10ODPA//TFMB | 332.2 | 10.14 | 780 | 39.7 | 65.1 |
| 18 | 80BPDA/20ODPA//TFMB | 321 | 3.14 | 720 | 38.7 | 60.9 |
| Comp 8 | 60BPDA/40ODPA//TFMB | Could not be made in to a film for testing | | | | |
| Comp 9 | BPDA//10TFMB/90 ODA | | | | | |

| EXAMPLE # | Water uptake | Dielectric Constant @ 1 kHz | Average peel strength at 330° C. (N/mm) | Average peel strength at 350° C. (N/mm) | Average peel strength at 380° C. (N/mm) | Average peel strength at 395° C. (N/mm) |
|---|---|---|---|---|---|---|
| 1 | 0.38 | 2.77 | | 0.1 | 11 | 1.4 |
| 2 | 0.42 | 3.14 | 1.1 | 1.6 | | |
| 3 | 0.73 | 3.1 | 1.6 | 1.9 | | |
| 4 | 0.844 | | 2.1 | 2.0 | | |
| 5 | 0.92 | | 2.0 | 2.2 | | |
| 6 | 1 | 3.28 | | | 2.0 | |
| 7 | | | 1.9 at 320° C. | 2.7 | 2.1 | |
| 8 | | | | 3.3 | | |
| | | | | 3.3 | | |
| 9 | | | | 2.5 | | |
| 10 | | | | | | |
| 11 | | | 2.5 | 3.2 | | |
| 12 | | | 1.1 | 3.2 | | |
| Comp 1 | 1.4 | 3.45 | | 0.2 | 0.7 | |
| Comp 2 | 1.5 | 3.3 | | 0.2 | 0.6 | |
| Comp 3 | 1.59 | 3.37 | | 0 | <0.1 | |
| Comp 4 | 3.2 | 3.24 | | 0.2 | 0.7 | |
| Comp 5 | 0.62 | 3.43 | | 1.6 | | |
| Comp 6 | | | | <0.1 | | |
| Comp 7 | | | | <0.1 | | |
| 17 | 0.74 | 3.04 | 0.5 | 1.4 | | |
| 18 | 0.74 | 2.98 | 0.9 | 1.3 | | |
| Comp 8 | | | | | | |
| Comp 9 | | | | 0.7 | 1.6 | |

TABLE 2

| EXAMPLE | | MD Etched | TD Etched | MD Thermal | TD Thermal |
|---|---|---|---|---|---|
| 7 | BPDA//43 TFMB/ 57 ODA | −0.125 | −0.081 | −0.208 | −0.183 |
| Comp 5 | 20PMDA/ 80ODPA//RODA | −0.505 | −0.506 | −0.588 | −0.583 |

What is claimed is:

1. A circuit board, comprising in the following order:
   a. a first polyimide coverlay comprising a polyimide derived from 100 mole % 3,3',4,4'-biphenyl tetracarboxylic dianhydride, based upon a total dianhydride content of the polyimide, 20 to 90 mole % 2,2'-bis(trifluoromethyl) benzidine, based upon a total diamine content of the polyimide, and 10 to 80 mole % 4,4'-oxydianiline, based upon the total diamine content of the polyimide;
   b. a first imaged metal layer
   c. a first electrically insulating layer having a first side and a second side; the first side of the first electrically insulating layer is next to the first imaged metal layer
   d. a second imaged metal layer; the second side of the first electrically insulating layer is next to the second imaged metal layer;
   e. a polyimide bondply comprising a polyimide derived from 100 mole % 3,3',4,4'-biphenyl tetracarboxylic dianhydride, based upon a total dianhydride content of the polyimide, 20 to 90 mole % 2,2'-bis(trifluoromethyl) benzidine, based upon a total diamine content of the polyimide, and 10 to 80 mole % 4,4'-oxydianiline, based upon the total diamine content of the polyimide;
   f. a third imaged metal layer;
   g. a second electrically insulating layer having a first side and a second side; the first side of the second electrically insulating layer is next to the third imaged metal layer
   h. a fourth imaged metal layer; the second side of the second electrically insulating layer is next to the fourth imaged metal layer;
   i. a second polyimide coverlay comprising a polyimide derived from 100 mole % 3,3',4,4'-biphenyl tetracarboxylic dianhydride, based upon a total dianhydride content of the polyimide, 20 to 90 mole % 2,2'-bis(trifluoromethyl) benzidine, based upon a total diamine content of the polyimide, and 10 to 80 mole % 4,4'-oxydianiline, based upon the total diamine content of the polyimide;
   wherein the polyimide bondply is in direct contact with the second imaged metal layer and exposed areas of the second side of the first electrically insulating layer; and in direct contact with the third imaged metal layer and exposed areas of the first side of the second electrically insulating layer;
   wherein the polyimide bondply has a peel strength from 0.7 to 2 N/mm as measured in accordance with IPC-TM-650-2.4.9d, when
      i) the first imaged metal layer, the first electrically insulating layer and the second imaged metal layer;
      ii) the polyimide bondply; and
      iii) the third imaged metal layer, the second electrically insulating layer and the fourth imaged metal layer are laminated at a lamination temperature from 300 to 380° C. and a pressure from 150 psi (10.55 Kg/cm) to 400 psi (28.13 Kg/cm);
   wherein the first polyimide coverlay is in direct contact with the first imaged metal layer and exposed areas of the first side of the first electrically insulating layer and wherein the second polyimide coverlay is in direct contact with the fourth imaged metal layer and exposed areas of the second side of the second electrically insulating layer; and
   wherein the first electrically insulating layer and the second electrically insulating layer are any electrically insulating material that can withstand the lamination temperature from 320 to 380° C.

2. The circuit board of claim 1, wherein the polyimide bondply comprises from 1 to 55 weight percent of a thermally conductive filler, dielectric fillers or mixtures thereof.

3. The circuit board of claim 1, wherein the first electrically insulating layer, the second electrically insulating layer or both comprise from 1 to 55 weight percent of a thermally conductive filler, dielectric fillers or mixtures thereof.

4. The circuit board of claim 1, wherein the first imaged metal layer, the second imaged metal layer, the third imaged metal layer and the fourth imaged metal layer are copper.

5. The circuit board of claim 1, wherein the polyimide bondply comprises from 1 to 55 weight percent of a thermally conductive filler, dielectric fillers or mixtures thereof;
   the first electrically insulating layer, the second electrically insulating layer or both comprise from 1 to 55 weight percent of a thermally conductive filler, dielectric fillers or mixtures thereof; and
   the first imaged metal layer, the second imaged metal layer, the third imaged metal layer and the fourth imaged metal layer are copper.

6. The circuit board of claim 1, wherein the first electrically insulating layer comprises a polyimide derived from 100 mole % 3,3',4,4'-biphenyl tetracarboxylic dianhydride, based upon a total dianhydride content of the polyimide, 20 to 90 mole % 2,2'-bis(trifluoromethyl) benzidine, based upon a total diamine content of the polyimide, and 10 to 80 mole % 4,4'-oxydianiline, based upon the total diamine content of the polyimide, or a polyimide derived from 100 mole % 3,3',4,4'-biphenyl tetracarboxylic dianhydride, based upon a total dianhydride content of the polyimide, and 100 mole % 2,2'-bis(trifluoromethyl) benzidine, based upon a total diamine content of the polyimide, and is in direct contact with the first imaged metal layer, the second imaged metal layer and exposed areas of the polyimide bondply.

7. The circuit board of claim 1, wherein the second electrically insulating layer comprises a polyimide derived from 100 mole % 3,3',4,4'-biphenyl tetracarboxylic dianhydride, based upon a total dianhydride content of the polyimide, 20 to 90 mole % 2,2'-bis(trifluoromethyl) benzidine, based upon a total diamine content of the polyimide, and 10 to 80 mole % 4,4'-oxydianiline, based upon the total diamine content of the polyimide, or a polyimide derived from 100 mole % 3,3',4,4'-biphenyl tetracarboxylic dianhydride, based upon a total dianhydride content of the polyimide, and 100 mole % 2,2'-bis(trifluoromethyl) benzidine, based upon a total diamine content of the polyimide, and is in direct contact with the fourth imaged metal layer, the third imaged metal layer and exposed areas of the polyimide bondply.

8. The circuit board of claim 1, wherein the first electrically insulating layer comprises a polyimide derived from 100 mole % 3,3',4,4'-biphenyl tetracarboxylic dianhydride, based upon a total dianhydride content of the polyimide, 20 to 90 mole % 2,2'-bis(trifluoromethyl) benzidine, based upon a total diamine content of the polyimide, and 10 to 80 mole % 4,4'-oxydianiline, based upon the total diamine content of the polyimide, or a polyimide derived from 100 mole % 3,3',4,4'-biphenyl tetracarboxylic dianhydride, based upon a total dianhydride content of the polyimide, and 100 mole % 2,2'-bis(trifluoromethyl) benzidine, based upon a total diamine content of the polyimide, and is in direct contact with the first imaged metal layer, the second imaged metal layer and exposed areas of the polyimide bondply; and wherein the second electrically insulating layer comprises a polyimide derived from 100 mole % 3,3',4,4'-biphenyl tetracarboxylic dianhydride, based upon a total dianhydride content of the polyimide, 20 to 90 mole % 2,2'-bis(trifluoromethyl) benzidine, based upon a total diamine content of the polyimide, and 10 to 80 mole % 4,4'-oxydianiline, based upon the total diamine content of the polyimide, or a polyimide derived from 100 mole % 3,3',4,4'-biphenyl tetracarboxylic dianhydride, based upon a total dianhydride content of the polyimide, and 100 mole % 2,2'-bis(trifluoromethyl) benzidine, based upon a total diamine content of the polyimide, and is in direct contact with the fourth imaged metal layer, the third imaged metal layer and exposed areas of the polyimide bondply.

9. The circuit board of claim 8, wherein the polyimide bondply comprises from 1 to 55 weight percent of a thermally conductive filler, dielectric fillers or mixtures thereof.

10. The circuit board of claim 8, wherein the first electrically insulating layer, the second electrically insulating layer or both comprise from 1 to 55 weight percent of a thermally conductive filler, dielectric fillers or mixtures thereof.

11. The circuit board of claim 8, wherein the first imaged metal layer, the second imaged metal layer, the third imaged metal layer and the fourth imaged metal layer are copper.

12. The circuit board of claim 8, wherein the polyimide bondply comprises from 1 to 55 weight percent of a thermally conductive filler, dielectric fillers or mixtures thereof;
the first electrically insulating layer, the second electrically insulating layer or both comprise from 1 to 55 weight percent of a thermally conductive filler, dielectric fillers or mixtures thereof; and
the first imaged metal layer, the second imaged metal layer, the third imaged metal layer and the fourth imaged metal layer are copper.

13. The circuit board of claim 8, wherein the first polyimide coverlay, the second polyimide coverlay or both comprise a pigment and a matting agent.

14. The circuit board of claim 13, wherein the pigment and the matting agent are both a low conductivity carbon black and the low conductivity carbon black is present in the first polyimide coverlay, the second polyimide coverlay or both in an amount from 2 to 20 weight percent.

15. The circuit board of claim 13, wherein the matting agent is polyimide particles.

16. The circuit board of claim 8, wherein the first polyimide coverlay, the second polyimide coverlay or both comprise a low conductivity carbon black and a matting agent.

17. The circuit board of claim 8 wherein the first electrically insulating layer, the second electrically insulating layer or both comprise a polyimide derived from 100 mole % 3,3',4,4'-biphenyl tetracarboxylic dianhydride, based upon a total dianhydride content of the polyimide, 40 to 90 mole % 2,2'-bis(trifluoromethyl) benzidine, based upon a total diamine content of the polyimide, and 10 to 60 mole % 4,4'-oxydianiline, based upon the total diamine content of the polyimide.

18. The circuit board of claim 8 wherein the first electrically insulating layer, the second electrically insulating layer or both comprise a polyimide derived from 100 mole % 3,3',4,4'-biphenyl tetracarboxylic dianhydride, based upon a total dianhydride content of the polyimide, 20 to 30 mole % 2,2'-bis(trifluoromethyl) benzidine, based upon a total diamine content of the polyimide, and 70 to 80 mole % 4,4'-oxydianiline, based upon the total diamine content of the polyimide.

19. The circuit board of claim 1, wherein the first polyimide coverlay, the second polyimide coverlay or both comprise a pigment and a matting agent.

20. The circuit board of claim 19, wherein the pigment and the matting agent are both a low conductivity carbon black and the low conductivity carbon black is present in the first polyimide coverlay, the second polyimide coverlay or both in an amount from 2 to 20 weight percent.

21. The circuit board of claim 19, wherein the matting agent is polyimide particles.

22. The circuit board of claim 1, wherein the first polyimide coverlay, the second polyimide coverlay or both comprise a low conductivity carbon black and a matting agent.

23. The circuit board of claim 1 wherein the first polyimide coverlay, the second polyimide coverlay and the polyimide bondply each comprise a polyimide derived from 100 mole % 3,3',4,4'-biphenyl tetracarboxylic dianhydride, based upon a total dianhydride content of the polyimide, 40 to 90 mole % 2,2'-bis(trifluoromethyl) benzidine, based upon a total diamine content of the polyimide, and 10 to 60 mole % 4,4'-oxydianiline, based upon the total diamine content of the polyimide.

24. The circuit board of claim 1 wherein the first polyimide coverlay, the second polyimide coverlay and the polyimide bondply each comprise a polyimide derived from 100 mole % 3,3',4,4'-biphenyl tetracarboxylic dianhydride, based upon a total dianhydride content of the polyimide, 20 to 30 mole % 2,2'-bis(trifluoromethyl) benzidine, based upon a total diamine content of the polyimide, and 70 to 80 mole % 4,4'-oxydianiline, based upon the total diamine content of the polyimide.

* * * * *